(12) United States Patent
Miloslavsky et al.

(10) Patent No.: US 8,347,239 B2
(45) Date of Patent: Jan. 1, 2013

(54) FAST LITHOGRAPHY COMPLIANCE CHECK FOR PLACE AND ROUTE OPTIMIZATION

(75) Inventors: Alexander Miloslavsky, Sunnyvale, CA (US); Gerard Lukpat, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 638 days.

(21) Appl. No.: 11/479,422

(22) Filed: Jun. 30, 2006

(65) Prior Publication Data
US 2008/0005704 A1  Jan. 3, 2008

(51) Int. Cl.
*G06F 17/50* (2006.01)
(52) U.S. Cl. ........... 716/52; 716/54; 716/55; 716/56
(58) Field of Classification Search ........... 716/5, 19, 716/21, 52, 53, 54, 106, 55, 56; 430/5
See application file for complete search history.

(56) References Cited

U.S. PATENT DOCUMENTS

| | | | |
|---|---|---|---|
| 5,252,508 A | 10/1993 | Masuda | |
| 5,546,225 A * | 8/1996 | Shiraishi | 359/559 |
| 6,004,701 A | 12/1999 | Uno et al. | |
| 6,077,310 A * | 6/2000 | Yamamoto et al. | 716/19 |
| 6,282,696 B1 * | 8/2001 | Garza et al. | 716/19 |
| 6,324,675 B1 | 11/2001 | Dutta et al. | |
| 6,349,403 B1 | 2/2002 | Dutta et al. | |
| 6,470,489 B1 * | 10/2002 | Chang et al. | 716/21 |
| 6,553,559 B2 | 4/2003 | Liebmann et al. | |
| 6,598,218 B2 * | 7/2003 | Lin | 716/21 |
| 6,770,403 B2 * | 8/2004 | Park et al. | 430/5 |
| 6,787,459 B2 | 9/2004 | Moniwa et al. | |
| 6,915,493 B2 | 7/2005 | Moulding et al. | |
| 6,952,818 B2 * | 10/2005 | Ikeuchi | 430/311 |
| 6,998,205 B2 * | 2/2006 | Huang | 430/5 |
| 7,001,693 B2 * | 2/2006 | Liebmann et al. | 430/5 |
| 7,032,194 B1 | 4/2006 | Hsueh et al. | |
| 7,147,976 B2 * | 12/2006 | Liebmann et al. | 430/5 |
| 7,346,865 B2 | 3/2008 | Su et al. | |
| 7,503,029 B2 | 3/2009 | Sinha et al. | |
| 7,703,067 B2 | 4/2010 | Sinha et al. | |
| 2004/0248043 A1 | 12/2004 | Shiraishi | |
| 2005/0086618 A1 | 4/2005 | Ito et al. | |

(Continued)

OTHER PUBLICATIONS

U.S. Appl. No. 11/394,466.

(Continued)

*Primary Examiner* — Jack Chiang
*Assistant Examiner* — Patrick Sandoval
(74) *Attorney, Agent, or Firm* — Fenwick & West LLP

(57) ABSTRACT

A computer is programmed to use at least one rule to identify from within a layout of an IC design, a set of regions likely to fail if fabricated unchanged. An example of such a rule of detection is to check for presence of two neighbors neither of which fully overlaps a short wire or an end of a long wire. The computer uses at least another rule to change at least one region in the set of regions, to obtain a second layout which is less likely to fail in the identified regions. An example of such a rule of correction is to elongate at least one of the two neighbors. The computer may perform optical rule checking (ORC) in any order relative to application of the rules, e.g. ORC can be performed between detection rules and correction rules i.e. performed individually on each identified region prior to correction.

22 Claims, 18 Drawing Sheets

U.S. PATENT DOCUMENTS

| | | | |
|---|---|---|---|
| 2005/0106473 A1* | 5/2005 | Huang | 430/5 |
| 2006/0046160 A1* | 3/2006 | Wallace et al. | 430/5 |
| 2006/0123380 A1* | 6/2006 | Ikeuchi | 716/21 |
| 2006/0262977 A1 | 11/2006 | Mitsui | |
| 2007/0128526 A1* | 6/2007 | Wallace et al. | 430/5 |
| 2007/0230770 A1* | 10/2007 | Kulkarni et al. | 382/149 |
| 2007/0294648 A1* | 12/2007 | Allen et al. | 716/4 |
| 2008/0076036 A1* | 3/2008 | Haffner | 430/5 |
| 2009/0132980 A1 | 5/2009 | Sinha et al. | |
| 2009/0138835 A1 | 5/2009 | Sinha et al. | |
| 2010/0131909 A1 | 5/2010 | Miloslavsky et al. | |

OTHER PUBLICATIONS

U.S. Appl. No. 11/395,006.
Kyoh, S. et al., "Lithography oriented DfM for 65nm and beyond", Design and Process Integration for Microelectronic Manufacturing IV, Proc. of SPIE, 2006, vol. 6156, 9 pgs.
Kotani, Toshiya et al., "Development of Hot Spot Fixer (HSF)", Design and Process Integration for Microelectronic Manufacturing IV, Proc. of SPIE, 2006, vol. 6156, 8 pgs.
Kim, Juhwan et al., "Hotspot Detection on Post-OPC Layout Using Full Chip Simulation Based Verification Tool: A Case Study with Aerial Image Simulation", Proceedings of SPIE, 2003, 919-925, vol. 5256, Bellingham, WA, 7 pgs.
Lucas K. et al., "Logic Design for Printability Using OPC Methods", Design & Test of Computer, IEEE, Jan.-Feb. 2006, 30-37, vol. 23, Issue 1, 8 pgs.
Charras, Christian et al., "Handbook of Exact String-Matching Algorithms", 2004, 1-17, London: King's College, 16 pgs.
Franek, Frantisek et al., "A simple Fast Hybrid Pattern-Matching Algorithm", 2005, 288-297, CPM 2005, LNCS 3537, Springer-Verlag Berlin Heidelberg, 10 pgs.
Cormen, Thomas H. et al., "Introduction to Algorithms", 1989, The MIT Press, Cambridge, Massachusetts London, England; McGraw-Hill Book Company, New York St. Louis San Francisco Montreal Toronto, 15 pgs.
Pan, David Z. et al., "Manufacturability-Aware Physical Layout Optimizations", 5 pgs.
Mitra, Joydeep et al., "RADAR: RET-Aware Detailed Routing Using Fast Lithography Simulations", DAC 2005, Jun. 13-17, 2005, 369-372, Anaheim, California, USA, 4 pgs.
Xu, Gang et al., "Redundant-Via Enhanced Maze Routing for Yield Improvement", Proc. of Asia and South Pacific Design Automation Conference, 2005, 4 pgs.
Huang, Li-Da et al., "Optical Proximity Correction (OPC)-Friendly Maze Routing", DAC 2004, Jun. 7-11, 2004, 186-191, San Diego, California, USA, 6 pgs.
Gupta, Puneet et al., "Manufacturing-Aware Physical Design", Computer Aided Design, 2003 International Conference on ICCAD-2003, 2003, 681-687, 7 pgs.
Author unknown, Knuth-Morris-Pratt string matching, ICS 161: Design and Analysis of Algorithms Lecture notes for Feb. 27, 1996, 12 pgs.
Entire prosecution history of U.S. Appl. No. 11/394,466.
Entire prosecution history of U.S. Appl. No. 11/395,006, now issued as US Patent 7,503,029.
U.S. Appl. No. 12/696,427, 59 pages.
Entire Prosecution History of U.S. Appl. No. 12/362,721, filed Jan. 30, 2009, Sinha et al.
Entire Prosecution History of U.S. Appl. No. 12/362,490, filed Jan. 29, 2009, Sinha et al.
United States Office Action, U.S. Appl. No. 12/362,490, Jul. 13, 2011, 8 pages.
United States Office Action, U.S. Appl. No. 12/362,721, Jul. 13, 2011, 9 pages.
Boyer, R.S. et al., "A Fast String Matching Algorithm," Communications of the ACM, 1977, pp. 762-772, vol. 20.
United States Office Action, U.S. Appl. No. 12/696,427, Jun. 6, 2011, 11 pages.
Office Action dated Dec. 8, 2010 in U.S. Appl. No. 12/696,427, 11 pages.
Amendment dated Mar. 8, 2011 in U.S. Appl. No. 12/696,427, 16 pages.
Office Action dated Jun. 9, 2008 in U.S. Appl. No. 11/394,466, 9 pages.
Amendment dated Oct. 9, 2008 in U.S. Appl. No. 11/394,466, 18 pages.
Office Action dated Dec. 17, 2008 in U.S. Appl. No. 11/394,466, 4 pages.
Amendment dated Jan. 5, 2009 in U.S. Appl. No. 11/394,466, 8 pages.
Office Action dated Mar. 16, 2009 in U.S. Appl. No. 11/394,466, 9 pages.
Amendment dated Jul. 16, 2009 in U.S. Appl. No. 11/394,466, 20 pages.
Notice of Allowance dated Dec. 3, 2009 in U.S. Appl. No. 11/394,466, 4 pages.
Office Action dated Jun. 9, 2008 in U.S. Appl. No. 11/395,006, 5 pages.
Amendment dated Oct. 9, 2008 in U.S. Appl. No. 11/395,006, 12 pages.
Notice of Allowance dated Jan. 12, 2009 in U.S. Appl. No. 11/395,006, 6 pages.
U.S. Appl. No. 12/362,490, 104 pages.
U.S. Appl. No. 12/362,721, 105 pages.

\* cited by examiner

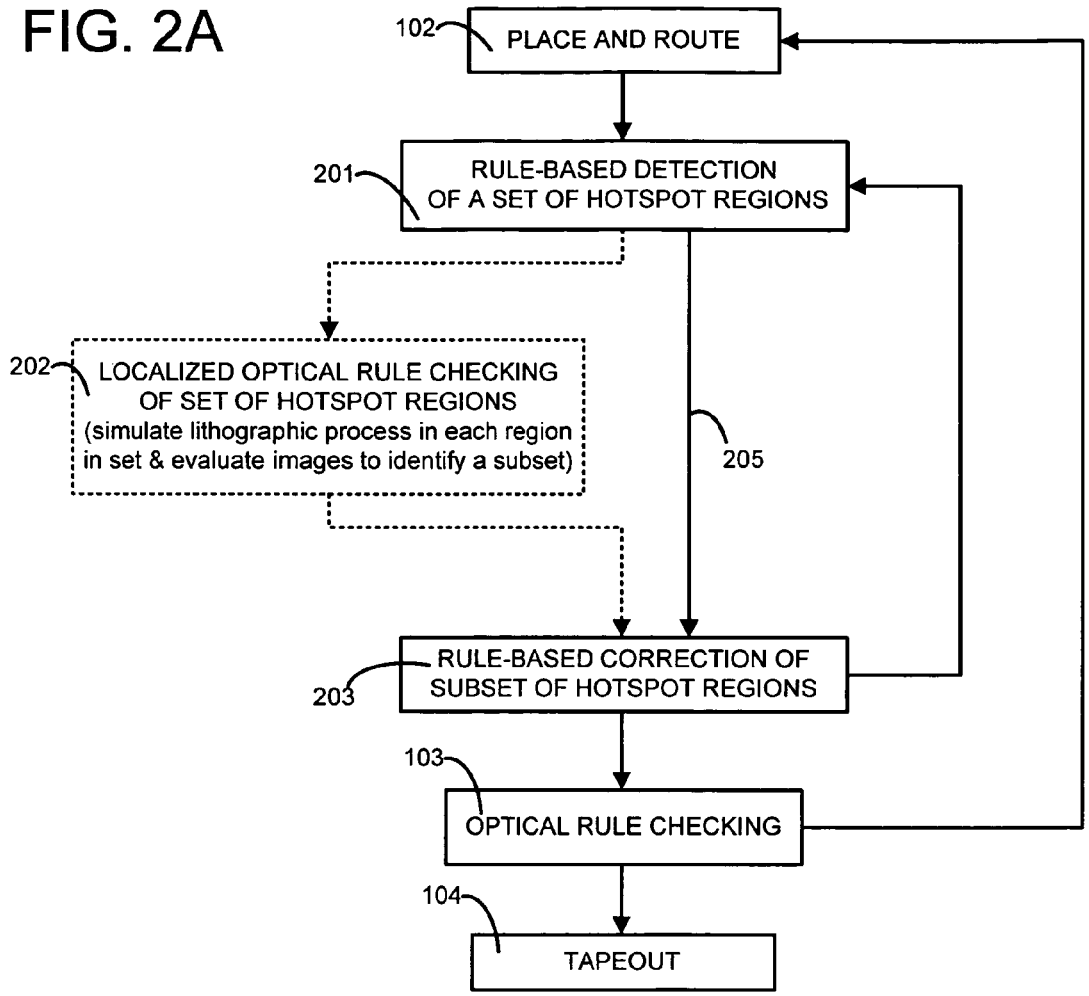
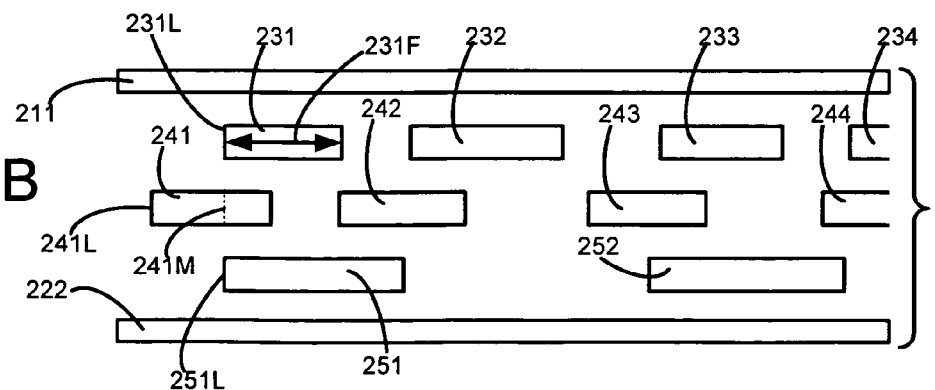

FAST LITHOGRAPHY COMPLIANCE CHECK FOR PLACE AND ROUTE OPTIMIZATION

BACKGROUND

1. Field of the Invention

The invention relates to design of layouts used in fabrication of semiconductor wafers. More specifically, the invention relates to a method and an apparatus for rule-based detection of pinches, bridges and similar hot spot regions in wires of an integrated circuit (IC) chip and repair of the regions.

2. Related Art

In the manufacture of integrated circuit (IC) chips, minimum feature sizes have been shrinking according to Moore's law. Currently the minimum feature size is smaller than the wavelength of light used in the optical imaging system. Accordingly it has become increasingly difficult to achieve reasonable fidelity (including resolution and depth of focus) between (a) a layout as designed in a computer and (b) shapes of circuit elements formed in a wafer after fabrication, which normally involves a number of processes such as photolithography followed by metal deposition and chemical mechanical polishing.

One prior art data flow in designing a layout is described in an article entitled "Hotspot detection on post-OPC layout using full-chip simulation-based verification tool: a case study with aerial image simulation" by Juhwan Kim and Minghui Fan, Proc. SPIE 5256, 919 (2003) that is incorporated by reference herein in its entirety. During such a prior art data flow, a place and route step 101 is typically followed by a step 102 of optical rule checking (ORC) which can take one or more days (e.g. more than 24 hours). A result of place and route step 101 is a layout of the type shown in FIG. 1B. This illustrative layout has three metal traces 111-113 which are arranged in a staircase pattern relative to one another.

Prior art ORC in step 103 is performed on a layout globally (to the knowledge of the inventors), and it includes resizing of the layout, followed by OPC on the resized layout, followed by simulation of lithographic processes to obtain image intensity, followed by evaluation of contours in the image intensity, as discussed in the next paragraph. Note that the result of ORC is the location of hot spots in a layout. The identified hot spots are typically fixed manually, in some prior art techniques. Manual fixing of hot spots is slow and laborious. Moreover, use of ORC to detect hot spots is itself slow.

Specifically, ORC includes a resizing (or upsizing) operation in which the width and length of rectangles are increased, if certain rules are satisfied (e.g. if minimum spacing constraints imposed in DRC rules are not violated). For more information on such operations, see an article entitled "Logic design for printability using OPC methods" by Lucas, K.; Yuan, C.-M.; Boone, R.; Wimmer, K.; Strozewski, K.; Toublan, O. published in Design & Test of Computers, IEEE, Volume 23, Issue 1, January-February 2006 Page(s):30-37, which is incorporated by reference herein in its entirety.

After such resizing (or upsizing), during an OPC operation within ORC, any reticle enhancement technology (RET) technique may be used, such as optical proximity correction (OPC), use of phase shifting masks (PSM) and/or sub-resolution assist features (SRAF). FIG. 1C illustrates shapes 121-123 which replace the respective traces 111-113 in FIG. 1B for use in fabrication. The following two articles have attempted to quantify the amount of RET (e.g. in the form of OPC) that a routed layout requires and modify the routing such that the burden of mask synthesis tools is reduced: [1] L-D. Huang, M. D. F. Wong: Optical Proximity Correction (OPC)-Friendly Maze Routing, DAC 2004; and [2] J. Mitra, P. Yu, D. Pan: RADAR: RET-aware detailed routing using fast lithography simulations, DAC 2005. These two articles are incorporated by reference herein in their entirety.

A wafer which is fabricated by use of the OPC-corrected layout in FIG. 1C may still have one or more defects. For example, FIG. 1D shows a fabricated layout including metal traces 131-133 wherein a trace 132 has a width Wpinch, which is significantly smaller than the nominal width W of corresponding trace 112 in the placed and routed layout of FIG. 1B. If Wpinch falls below a minimum limit, it causes an open circuit failure in the IC chip. Although a pinching defect has been illustrated in FIG. 1D, a similar bridging defect is also possible where, e.g., trace 132 merges enough with trace 131 to cause a short circuit failure in the IC chip. Such defects in the fabricated layout are commonly called "hot spots." To ensure that silicon produced with sub-wavelength geometries functions as intended in the original layout, one may use a layout verification tool. For example, a tool called SiVL-LRC available from Synopsys, Inc. reads in the IC layout and simulates a lithographic process, including optical, resist and etch effects, to generate an image intensity. Contours in the image intensity formed by a predefined threshold are then evaluated relative to the intended layout, and out of-tolerance regions are reported. Evaluation of contours of image intensity can be performed in any manner, e.g. by measurement of critical dimension and/or gradient of image intensity.

Note that the operations, (i) OPC that a particular layout needs for fabrication at a particular wavelength of light and (ii) simulation by SiVL-LRC to generate the silicon image followed by layout verification, normally take several days of simulation time for a 1-million gate design, when using a computer (e.g. PC) with a central processing unit (CPU) operating at 2 GHz and equipped with 1 GB memory. At this stage, if there are no defects that need correction, the layout is taped out in step 104, followed by step 105 in which a mask is synthesized for use in fabrication of semiconductor wafers. Current technology (prior to the invention described below) addresses any issues found by ORC in step 103 by application of design rules that are typically specified by a fabrication facility ("fab") and returning to step 102. However, use of fab-specified design rules can result in over-specification of a design or an unnecessarily large number of defects from fabrication thereby reducing yield.

A commonly-owned and co-pending U.S. patent application Ser. No. 11/394,466 filed on Mar. 31, 2006 and entitled "A RANGE PATTERN DEFINITION OF SUSCEPTIBILITY OF LAYOUT REGIONS TO FABRICATION ISSUES" by Subarnarekha Sinha et al. is incorporated by reference herein in its entirety. Also incorporated by reference herein in its entirety is another commonly-owned and co-pending U.S. patent application Ser. No. 11/395,006 filed on Mar. 31, 2006 and entitled: "IDENTIFYING LAYOUT REGIONS SUSCEPTIBLE TO FABRICATION ISSUES BY USING RANGE PATTERNS" by Subarnarekha Sinha et al.

SUMMARY

A computer is programmed in accordance with the invention to use at least one rule to identify from within a layout of an IC design, a set of regions that are likely to fail if fabricated unchanged ("hot spot"). An example of such a rule of detection is to check for presence of two neighbors neither of which fully overlaps a short wire or an end of a long wire located between them. The computer uses another rule to change at least one region in the set of regions, to obtain a second layout which is less likely to fail in the changed region(s). An example of such a rule of correction is to elongate at least one of two neighbors of a wire by a distance sufficient to cause the elongated neighbor to be coextensive with the wire (in a longitudinal direction thereof). In several embodiments of the invention each rule of correction is associated with a corresponding rule of detection. In such embodiments, the correction rule to be applied to a given hot spot region is identified from the association with its corresponding detection rule which identifies the given hot spot region.

Such a computer may be optionally programmed in some embodiments of the invention to perform simulation of a lithographic process and evaluation of an image generated by the simulation in any order relative to application of the rules of detection and correction. For example, image simulation and evaluation can be performed after application of detection rules and before application of correction rules, in which case these operations are performed individually on each identified hot spot candidate. In some embodiments, no further image simulation is performed and instead the layout resulting from application of the correction rules is directly taped out for use in mask synthesis.

Other embodiments perform image simulation and evaluation as just described, i.e. locally, and also repeat the image simulation and evaluation at a global level on the layout resulting from application of the correction rules, followed by place and route, or tapeout if no defects remain. Still other embodiments do not perform image simulation and evaluation locally between application of detection and correction rules and instead perform image simulation and evaluation only at a global level on a layout generated by place and route, and a set of regions identified by such global operations are then used with above-described detection rules (which are applied locally to each identified region in the set) to identify a subset of regions that can be corrected by application of correction rules. The subset of regions to be corrected is typically, but not necessarily, smaller than the set of regions identified by the global operations.

In some embodiments, the image simulation and contour evaluation are performed together with and immediately after one or more optional acts such as resizing (i.e. upsizing) and/or optical proximity correction (OPC), in a single stage which is also referred to as optical rule checking (ORC). However other embodiments do not perform one or more such acts, e.g. resizing may be skipped or OPC may be skipped or both skipped. Moreover, some embodiments use detection rules of the type described herein with other correction rules and other embodiments use correction rules of the type described herein with other detection rules. Also, some embodiments apply detection rules of the type described herein to layouts of polygons while other embodiments apply similar detection rules to contours generated by simulation of a lithographic process. Hence, numerous such embodiments will be apparent to the skilled artisan in view of this disclosure.

BRIEF DESCRIPTION OF THE DRAWINGS

FIG. 2A illustrates, in a data flow diagram in accordance with the invention, rule based detection of hot spots and rule based correction of the detected hot spots.

FIGS. 2B-2H and FIG. 3 illustrate a portion of a layout at various stages in the flow of FIG. 2A.

DETAILED DESCRIPTION

Figure 1A:
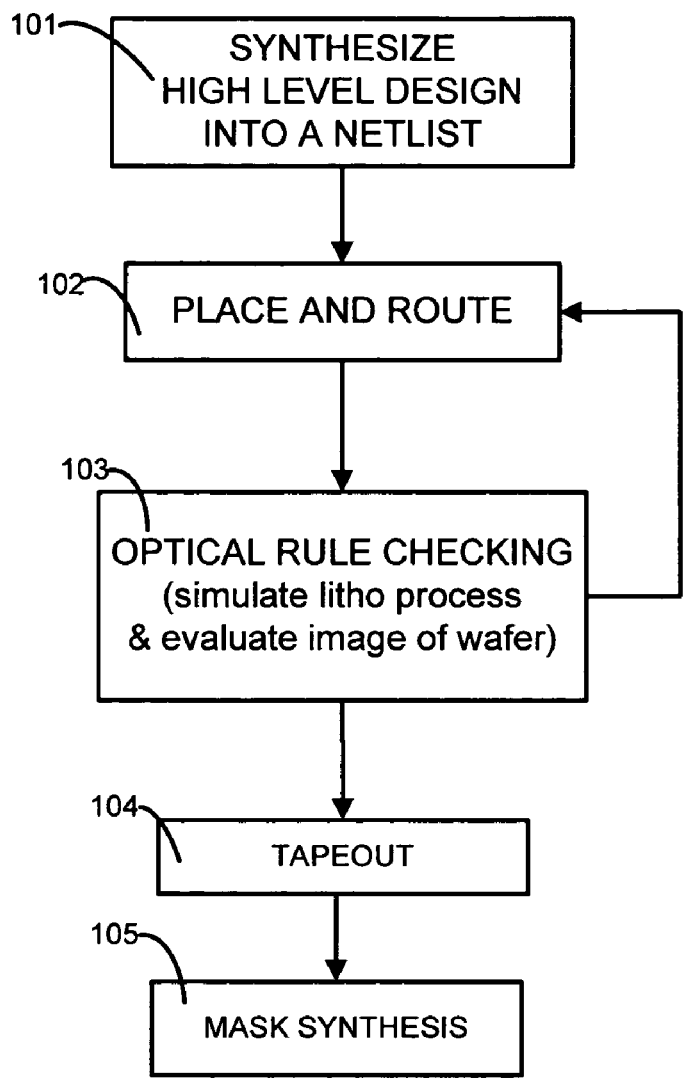
FIG. 1A shows a prior art data flow for conversion of an IC design specified in a high level design language (HDL) into a mask for use in fabricating a semiconductor wafer.
Figure 1B:
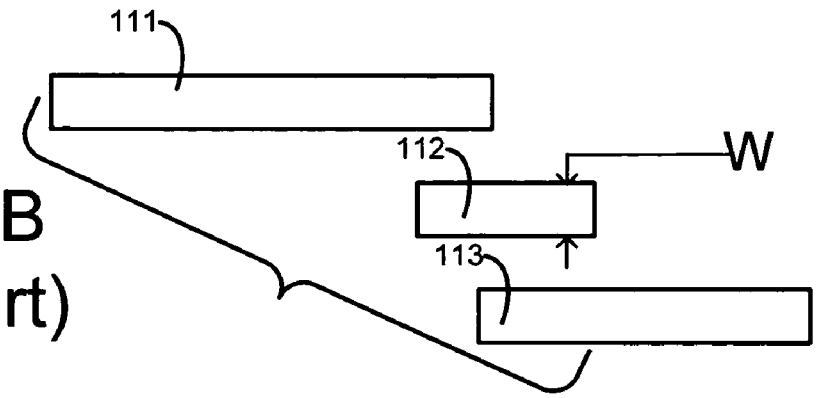
FIGS. 1B-1D show a portion of a layout at various stages in the flow of FIG. 1A.
Figure 1C:
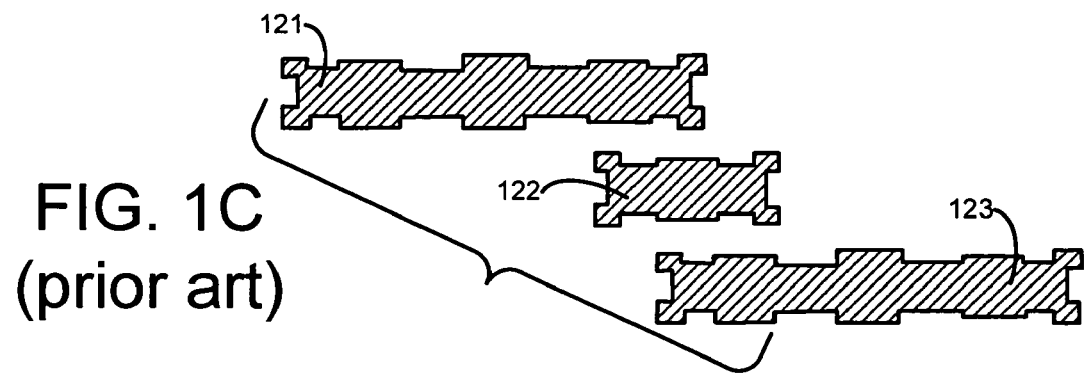
Figure 1D:
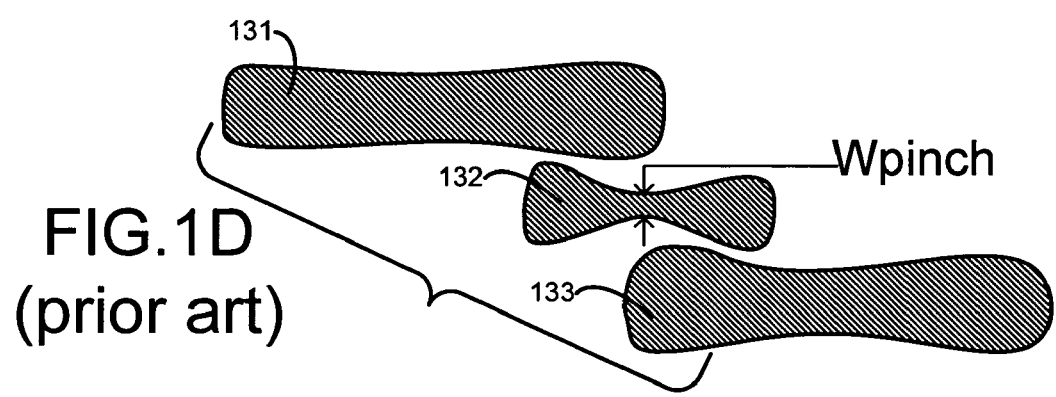

A computer 150 (FIG. 10A) is programmed, in accordance with the invention, to perform acts 201 and 203 (FIG. 2A) in any order relative to a place-and-route operation 102 and an ORC operation 103.

Operation 102 is performed using any prior art place-and-route tool, such as the Astro product available from Synopsys, Inc. Moreover, in prior art ORC operation 103, a simulation is performed of a lithographic process to be used to build the integrated circuits in a semiconductor wafer, and the simulation generates image intensities to which are applied one or more evaluation criteria such as measurement of critical dimension of contours. Each contour in a simulated image represents a side or a corner of a polygon in the layout input to the simulation.

In some embodiments of the invention, computer 150 is programmed to perform prior art ORC operation 103 as follows: (1) Simulate wafer image intensities at a given defocus condition, (2) Use a threshold on the wafer image intensities at a given exposure value to form contours, (3) Measure distance between contours in various locations, (4) Mark any location as a hot spot if the measured distance is more than, e.g., 10% different than distance measured on the corresponding location on the layout input to the simulation, (5) Repeat Steps 1-4 across the process window, i.e., for the range of possible exposure values and defocus conditions. Note that a location is deemed to be a "Hot Spot" if it is flagged in Step 4 at one or more process-window points (i.e. a particular exposure value and a particular defocus condition).

After operations 102 and 103, several embodiments of the invention perform an act 201, wherein computer 150 automatically uses one or more detection rules 997 (FIG. 10A) to identify from within a layout of an IC design, a set of regions likely to fail if fabricated unchanged. Note that the detection rules 997 used in act 201 of some embodiments are applied to a group of three adjacent features parallel to one another in a layout. Note however, that the detection rules 997 used in act 201 can be different. For example an alternative embodiment checks in act 201 if a middle feature "A" (see FIG. 2G) is separated from a vertical feature "B" by less than a user-defined distance.

Figure 6A:
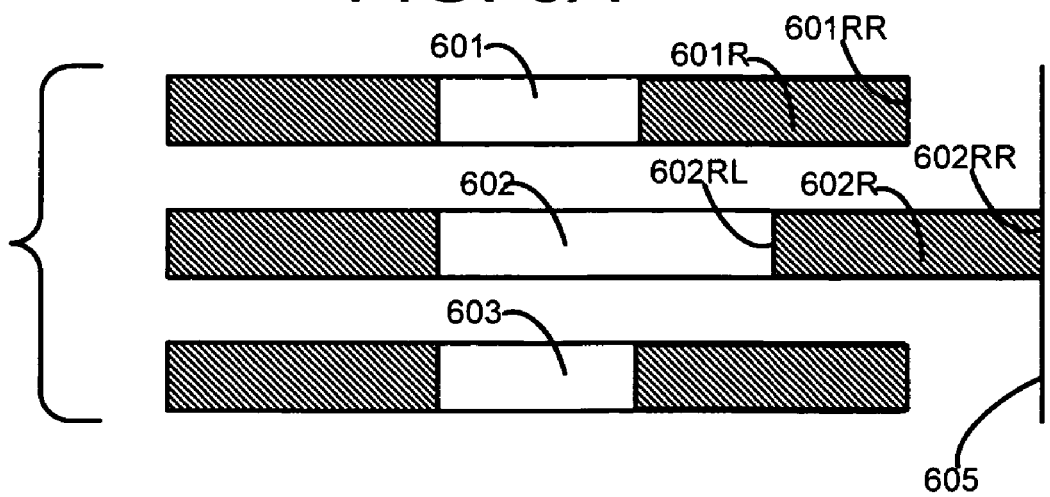
FIGS. 6A-6C illustrate configurations of layout regions that are respectively recognized as three types of hot spots in some embodiments of the invention.
Figure 6B:
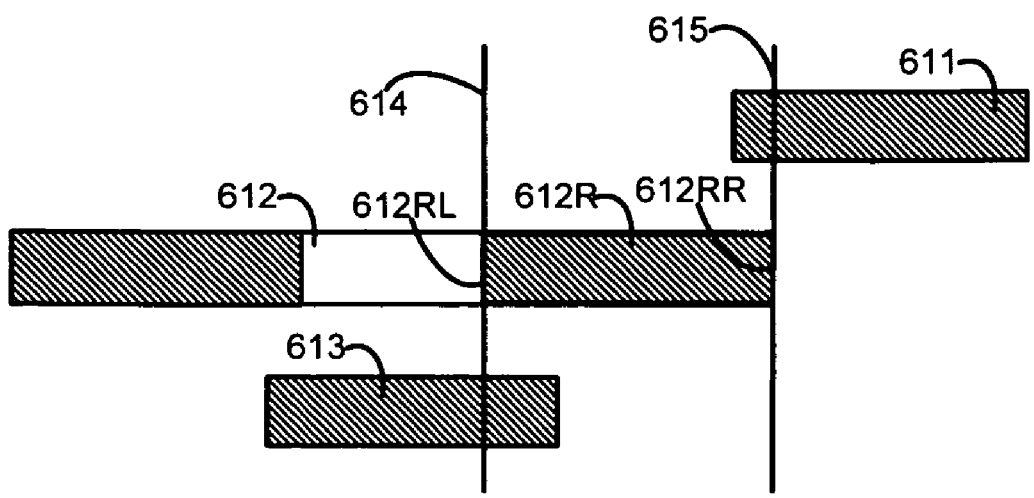
Figure 6C:
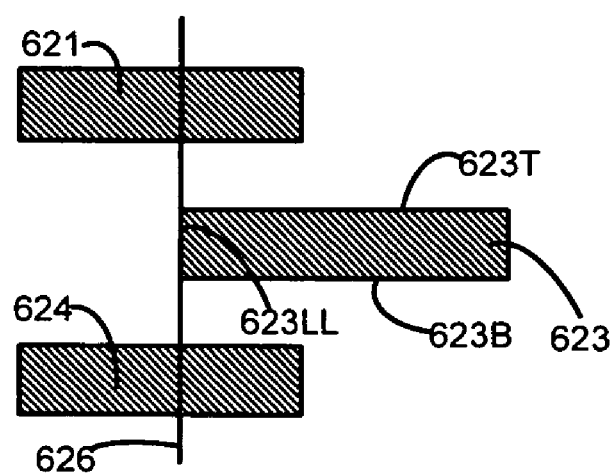

Note further that the although detection rules 997 in act 201 are applied in some embodiments to groups of adjacent features in a layout of the type shown in FIG. 2B, in other embodiments of act 201 similar or identical rules are applied to groups of adjacent contours obtained from simulation of one or more lithographic processes on the layout. For example, detection rules described below in reference to the layouts in FIGS. 6A-6C are applied to corresponding contours obtained from simulation, although with different user-defined distances (e.g. increased by 25%).

Next computer 150 of in a first type of embodiments automatically performs the ORC operation in a localized manner in an act 202 which is optional, on a small piece of the layout represented by a region in the set identified in act 201. Note also that act 202 is performed repeatedly in the first type of embodiments, once for each region in the set detected in act 201. Note further that in act 202, computer 150 of the first type of embodiments performs simulation of a fabrication process in each region, followed by evaluation of the set of images that are generated by simulation (e.g. by measuring critical dimension(s) of contours in each image). In act 202, computer 150 may optionally perform resizing (e.g. upsizing) and/or optical proximity correction (OPC). Note that act 202 is not performed in a second type of embodiments which simply bypass this act, as shown by arrow 205 in FIG. 2A. Finally, in act 203, one or more rules 998 (FIG. 10A) are used to apply corrections in regions (which are confirmed to be hot spots in the first type of embodiments that perform act 202 or which are unconfirmed in the second type of embodiments that skip act 202). Note that correction rules 998 that are applied in act 203 to hot spot regions in several embodiments are associated with corresponding detection rules 997 which are used to identify the hot spot regions (in some embodiments, each detection rule 997 is associated with a correction rule 998, in a one-to-one correspondence therebetween).

After correction rules 998 are applied in act 203, this embodiment of computer 150 may optionally repeat the just-described acts 201 and 203 (with the first type of embodiments also performing act 202 therebetween) to ensure that changes introduced by the corrections in act 203 are themselves not causing hot spots. When no hot spots are found in act 202 in the first type of embodiments (or in act 201 in the second type of embodiments), computer 150 of these embodiments proceeds to act 103 in which ORC is performed once again, but this time on a global scale, e.g. across the entire IC design in the normal manner. If ORC in act 103 finds no issues, the resulting layout is taped out as per act 104 for use in mask synthesis followed by wafer fabrication. If any additional regions likely to fail are identified in act 103 (which is performed after act 203), the additional regions may be corrected in any manner, e.g. by human re-design of the additional regions, or by rip-up and reroute by performing act 102

In an example of a rule of detection 997, the above-described computer 150 is programmed to perform the following check—for a given feature (which can be either a short rectangle of a predefined length, or one end (of the predefined length) of a long rectangle), look for presence of at least two adjacent features none of which fully overlap the given feature. The word "overlap" is not used herein to mean a physical overlap such that two rectangles contact one another to form a short circuit (i.e. electrical connection). Instead, the word "overlap" is used in this document to mean that an adjacent feature extends along a length of a given feature.

For example, as shown in FIG. 2B, a rectangle 231 has an adjacent rectangle 211 which extends across the full length 231F of this rectangle 231, and hence rectangle 211 "overlaps" rectangle 231. Due to the just-described overlap, this rectangle 231 is not a hot spot candidate, in accordance with a rule of detection described in the previous paragraph, even though rectangles 241 and 242 do not fully extend across the length 231F of (i.e. do not fully overlap) rectangle 231. Moreover, in FIG. 2B, rectangle 241 has two neighbors 231 and 251 that do not extend fully up to a left edge 241L of rectangle 241. Instead, rectangles 231 and 251 that are respectively located above and below rectangle 241, both extend only up to an internal location in rectangle 241 denoted in FIG. 2B by a dashed line 241M. As no rectangle extends across the left region of rectangle 241, for this reason rectangle 241 is determined to be a hot spot candidate according to the detection rule described in the previous paragraph.

Figure 2C:
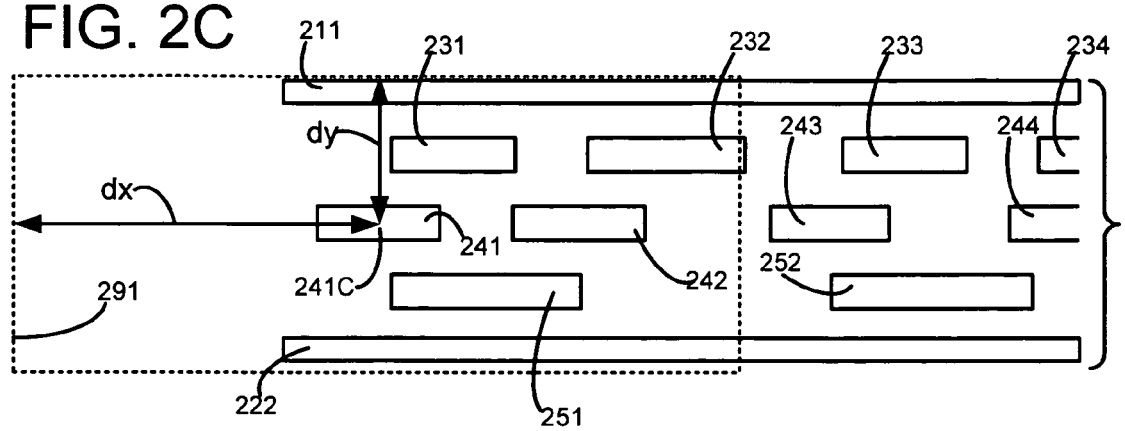

On finding such a hot spot candidate, computer 150 automatically identifies a region of a predefined size surrounding the hot spot candidate for use in the first type of embodiments in localized ORC as per act 202 (described above) or for use in correction in the second type of embodiments. In the example of FIG. 2B, a region 291 is identified centered at a center 241C of the hot spot candidate rectangle 241 and extending a distance dx on both sides of center in horizontal direction and a distance dy on both sides of center in vertical direction as shown in FIG. 2C. Distances dx and dy are user-defined distances, and can be identical to one another. For example, a distance 1000 nm is supplied by a user in some embodiments implemented by a technology limited to 90 nm as its critical dimension.

The above-described application of detection rules 997 (FIG. 10A) is performed multiple times in act 201, so that all hot spot candidates in an IC layout are identified by the first type of embodiments when entering act 202. On performing act 201 (e.g. after returning from act 203), computer 150 eventually finds that rectangles 232, 233, 234, 251 and 252 are all overlapped by at least one neighbor, and hence decides that these rectangles are not hot spot candidates. Computer 150 further finds that rectangle 242 is not fully overlapped by any neighbor and hence decides that this rectangle is a hot spot candidate according to the detection rule. Accordingly computer 150 additionally identifies a region 292 (FIG. 2E) for use in act 202 in the first type of embodiments. In this manner, any number of such regions are identified in act 201.

As noted above, ORC is performed in a localized manner in some first type of embodiments that perform act 202, e.g. performed on an individual region 291 which has been identified by act 201 as containing a hot spot candidate. So, a number of hammerheads, serifs and assist features are added only in region 291 (at this stage) during the OPC process. Next, in the localized ORC, a simulation is performed using a model of a wafer fabrication process ("process model"), e.g. using one or more convolution kernels to simulate the wafer image distribution that results from a lithography process. The image intensity that is generated by such simulation during the localized ORC operation in act 202 of the first type of embodiments takes into account a combination of optical effects, resist effects, and etch effects of a semiconductor wafer fabrication process when creating region 291 in a wafer, for example, a metal layer (or a polysilicon layer).

Figure 2D:
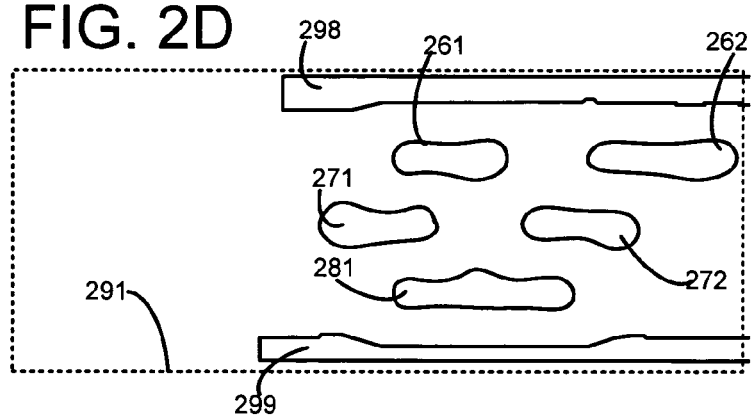
Figure 2E:
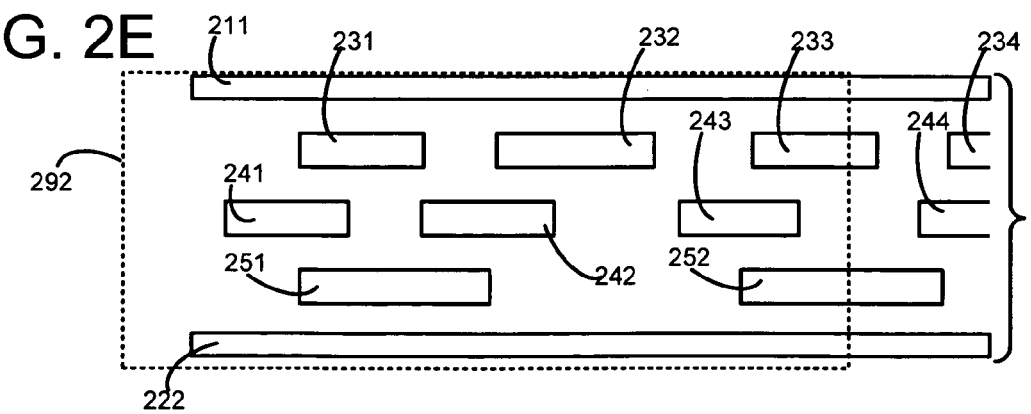

Illustrative contours 261, 262, 271, 272, 281, 298 and 299 of image intensity that are generated from performance of localized ORC only in region 291 are shown in FIG. 2D. In this first type of embodiment, no work is done in act 202 anywhere outside of region 291 because the ORC operation that is performed in act 202 is localized to only region 291.

Figure 2F:
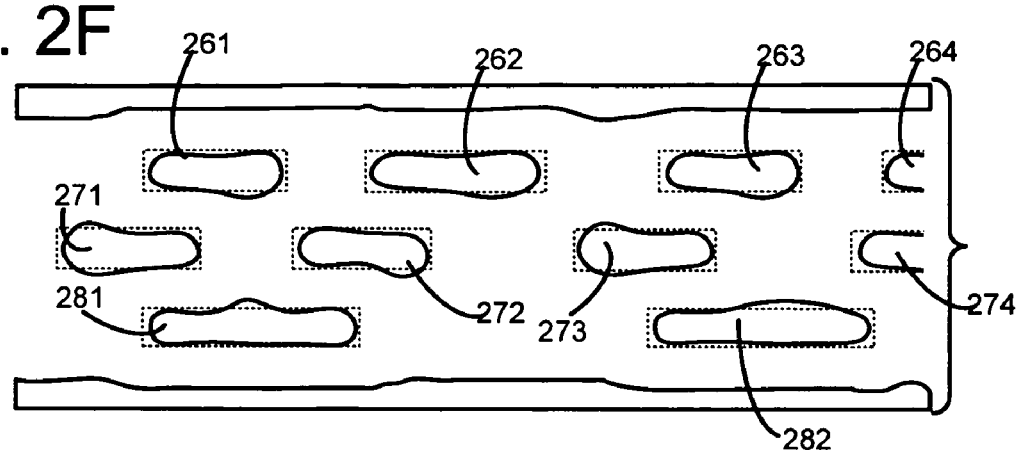

Note that act 202 is performed multiple times in some of the first type of embodiments, once for each region that contains a hot spot candidate as identified by act 201. For example, on such repeated performance of act 202, contours 261-264, 271-274 and 281-282 are generated as illustrated in FIG. 2F.

Note that act 202 is not performed, in this first type of embodiment, in any regions of the layout that are not identified by act 201, i.e. which are not suspected to be hot spots. Avoiding performance of ORC in act 202 on regions that do not contain hot spot candidates improves the speed and reduces memory requirements, as compared to performance of ORC on a layout globally.

Next, this embodiment of the invention evaluates each of the contours 261, 262, 271, 272, 281, 298 and 299 according to one or more predetermined rules to confirm that contour 271 which corresponds to rectangle 241 (which is the hot spot candidate under evaluation) does in fact result in failure. For example, the minimum width of contour 271 may be measured. Moreover, contour 271 may be evaluated for appropriate location relative to the location of one or more vias (located in another layer which is not shown in FIG. 2D).

Figure 3:
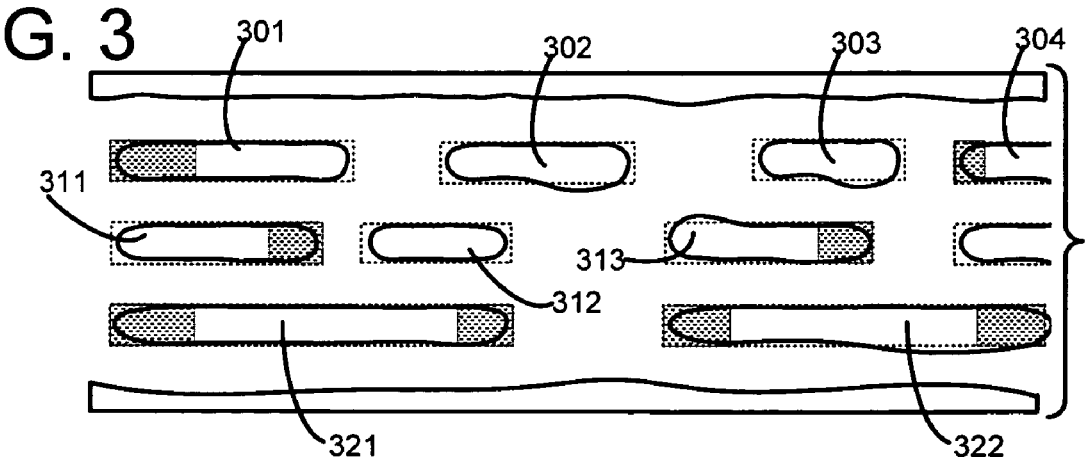

If contour 271 is found to be defective at the end of localized ORC then its corresponding rectangle 241 is changed in accordance with the invention. The specific change that is done on rectangle 241 depends on the corresponding rule used to detect the hot spot and identify the region which contains rectangle 241. In some embodiments a rule 998 that is associated with a detection rule 997 makes all three rectangles 241, 231 and 251 substantially uniform relative to one another, in the longitudinal direction of rectangle 241. For example, in one embodiment, rectangles 231 and 251 (FIG. 2C) are automatically extended by computer 150 towards left to line up with a left edge of rectangle 241. This correction rule is illustrated in FIG. 3, wherein left edges of all three rectangles 301, 311 and 321 are aligned to one another in the vertical direction. Such a correction rule to align edges of neighboring rectangles eliminates a hot spot that would otherwise result from narrowing of contour 271 (FIG. 2D) towards its center, in this illustrative embodiment. Although elongation of both neighbors has been illustrated, only one neighbor may be elongated in other embodiments of such a rule 998. Moreover, if rectangle 241 does not cover a via then it may be shortened in a correction rule of some embodiments, instead of (or in addition to) elongation of neighboring rectangles 251 and 231. One or more such rules 998 that are applied, to correct a hot spot candidate which has been confirmed to be defective by use of localized ORC, can be different depending on the embodiment.

Figure 2G:
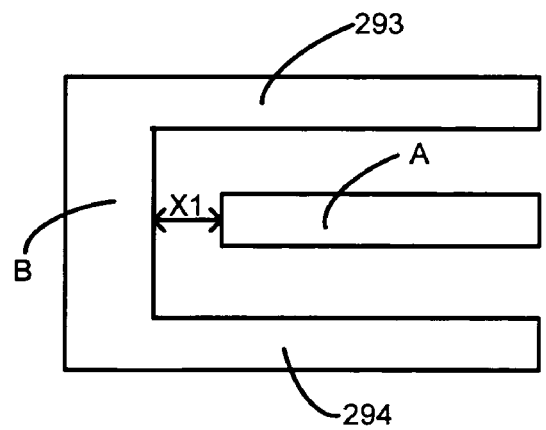
Figure 2H:
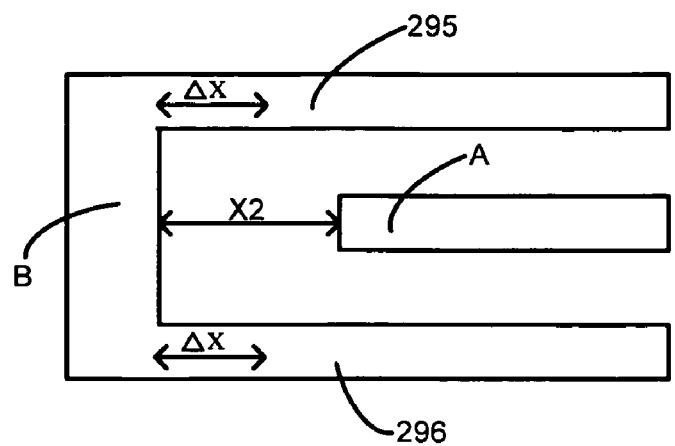

In some embodiments, a detection rule 997 identifies a hotspot region containing three rectangles as shown in FIG. 2G, wherein rectangle A is located between features 293 and 294. If the left side of rectangle A is too close to the right side of feature B, i.e. if distance X1 is smaller than a user-defined distance (such as five times minSpacing) then a hot spot is deemed to be present (which occurs in a fabricated wafer in the form of a bridge wherein A is electrically connected to B). Accordingly, on detecting such a hot spot region, a computer 150 is programmed in several embodiments to automatically apply a correction rule 998 to such a hot spot region by elongating features 293 and 294, to the left in FIG. 2G through a distance Δx, and these elongated features are labeled in FIG. 2H as 295 and 296. Feature B is also moved over to the left by the distance Δx in FIG. 2H, so that the distance between features B and A becomes X2=X1+Δx.

Depending on the embodiment, computer 150 may perform optical rule checking (ORC) in any order relative to application of the above-described rules in acts 201 and 203.

Figure 4A:
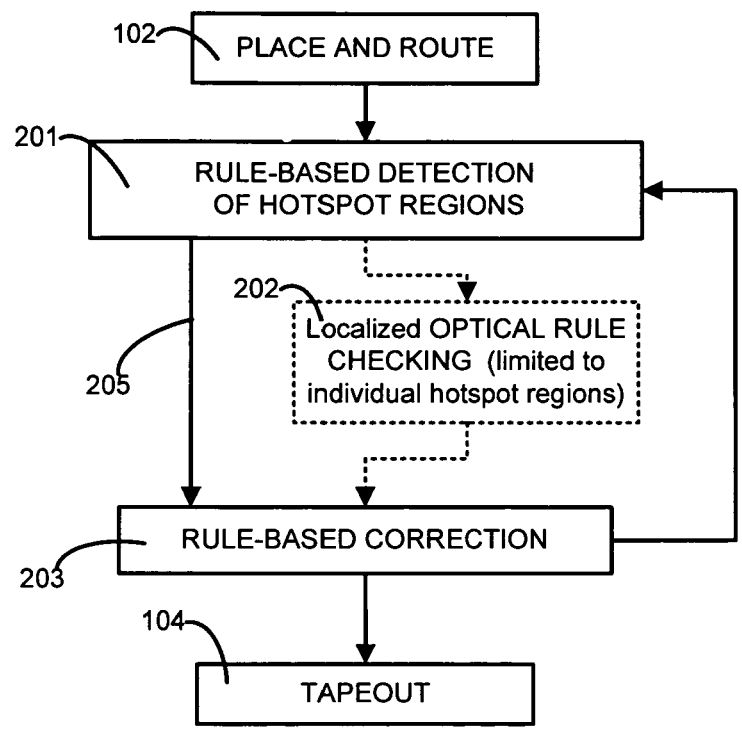
FIGS. 4A and 4B illustrate, in flow charts, two embodiments also in accordance with the invention, that perform rule based detection of hot spots and rule based correction of the detected hot spots.

Specifically, FIG. 4A illustrates ORC being performed in some embodiments (called first type of embodiments) between use of detection rules and use of correction rules. Note that act 202 is optional and is not performed in other embodiments (called second type of embodiments). The flow shown in FIG. 4A is similar to the flow shown in FIG. 2A because ORC is performed (in the first type of embodiments) individually on each identified region prior to correction. However, in the flow of FIG. 4A, no further ORC is performed (in the first type of embodiments) and a layout which results from application of the correction rules is taped out (in act 104 as per FIG. 4A), and then used directly in mask synthesis. Among various kinds of first type of embodiments, FIG. 4A differs from FIG. 2A because FIG. 2A embodiments of the first type perform ORC twice, i.e. locally, and also repeat the ORC at a global level on the layout resulting from application of the correction rules, followed by place and route if necessary, prior to tape out. Note that acts 201, 202 and 203 when performed in sequence in the first type of embodiments (e.g. see FIG. 2A and FIG. 4A) are together referred to as "fast lithography compliance checking" and a computer programmed with these steps is called "fast lithography compliance checker."

Figure 4B:
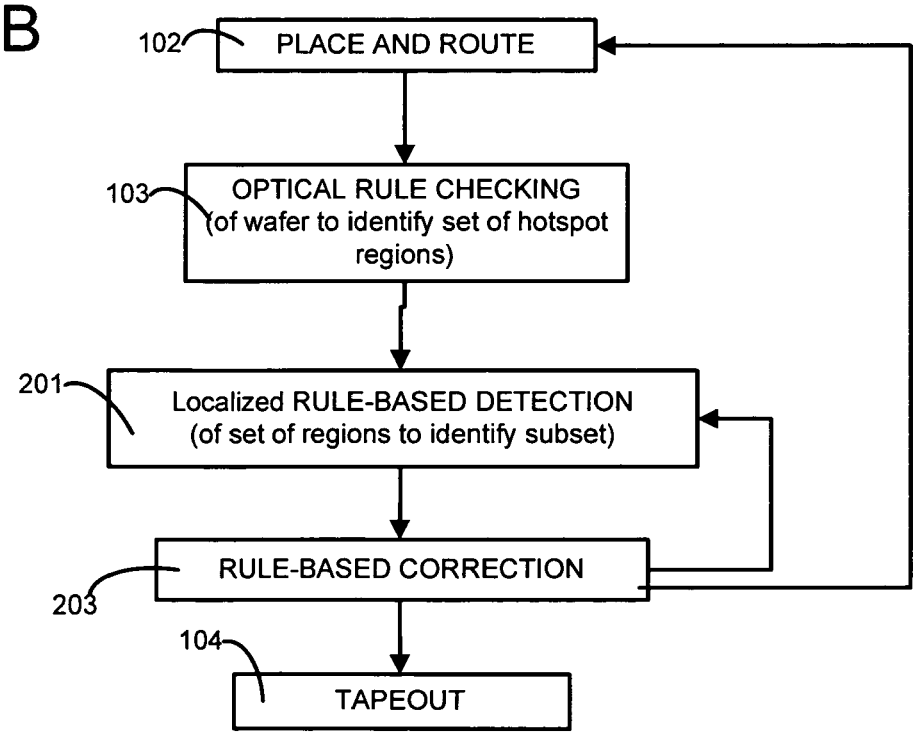

Still other embodiments do not perform ORC locally between application of detection and correction rules and instead perform ORC in the normal manner only at a global level on a layout generated by place and route as shown in FIG. 4B. Thereafter, in these embodiments, the regions which are identified as containing hot spots (from the layout as a whole) by the ORC operation are checked by application of detection rules to identify a subset of regions that are likely to be corrected by use of correction rules in act 203. Act 202 is not performed in such other embodiments (some of which are of the second type), which follow the data flow shown in FIG. 4B. In these other embodiments, the results of act 203 are reevaluated in act 201. If hot spots remain after repeated performance of act 201, then in these embodiments (as well as in embodiment of FIG. 2A), a region surrounding the hot spot is ripped up, followed by returning to place and route operation 102 which does re-routing in the ripped up region under different constraints (so that a different layout is generated). As noted at the beginning of this paragraph, ORC performed in act 103 in the flow of FIG. 4B is identical to ORC that is normally performed.

Note that the data flow in FIG. 4A performs rule-based detection in act 201 on the layout globally, while localized ORC is performed in some first type of embodiments in act 202. In contrast, the data flow in FIG. 4B performs ORC globally on the layout as a whole in act 103, and rule-based detection in act 201 is performed locally in the individual regions identified by act 103.

Many embodiments of the type illustrated in FIGS. 2A, 4A and 4B use design flows with strong resizing in the ORC act. In strong resizing, the computer automatically fattens wires by more than 25% of the original width, e.g. width 100 nm is increased to 150 nm if spacing permits. The computer assumes that printing of isolated lines is done well by the fabrication process (which also prints dense lines well).

Figure 5A:
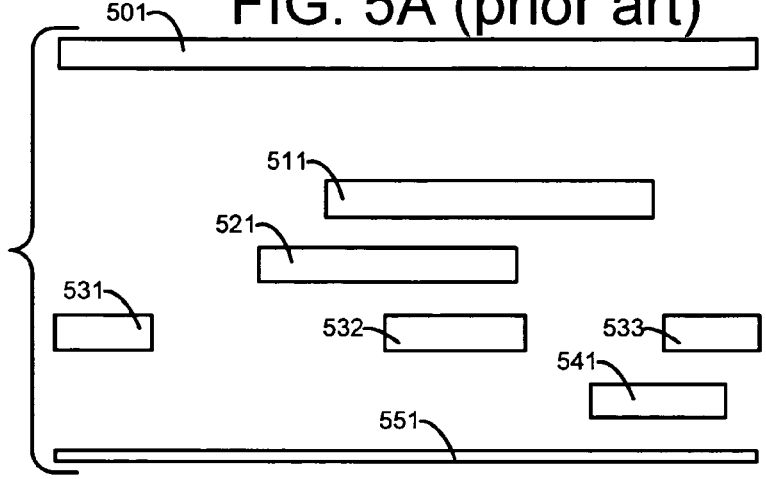
FIG. 5A illustrates a hot spot in an IC layout of the prior art.
Figure 5B:
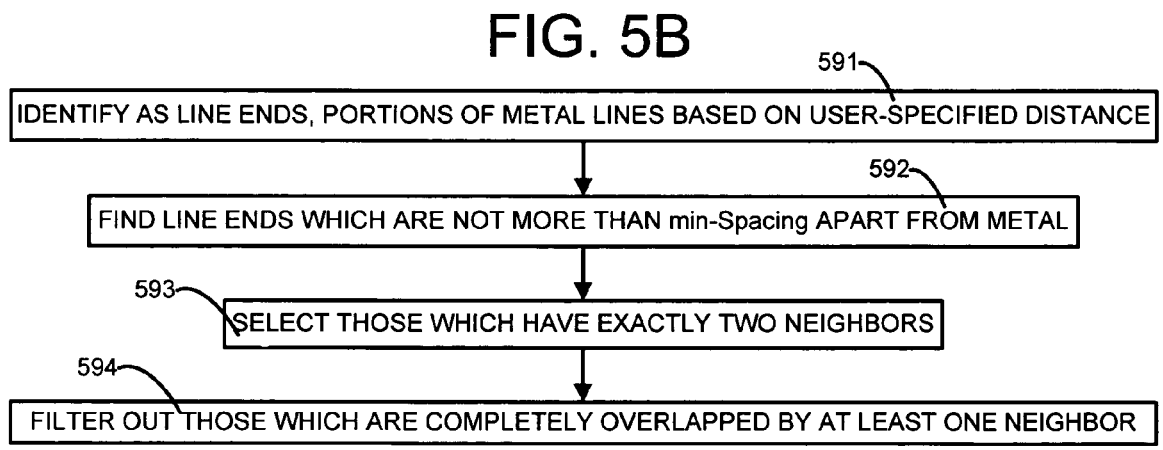
FIG. 5B illustrates a method that is performed in act 201 (FIG. 2A) in some embodiments of the invention, to identify a region containing the layout of FIG. 5A as a candidate for a hot spot.

Rule-based identification of hot spots in several embodiments performs the method of FIG. 5B whose operation is illustrated on a sample layout shown in FIG. 5A. Specifically, in several embodiments, in an act 591, computer 150 automatically identifies as line ends (whose printability is to be evaluated), certain portions of rectangles that are to form metal lines, based on a user-specified distance. For example, if the user specifies 400 nm as the line end distance, then this distance is used from each end of a rectangle to identify that rectangle's line ends. If a rectangle is shorter than the user-specified distance, then that entire rectangle is considered a line end (i.e. short wires are treated no different from line ends).

Figure 5C:
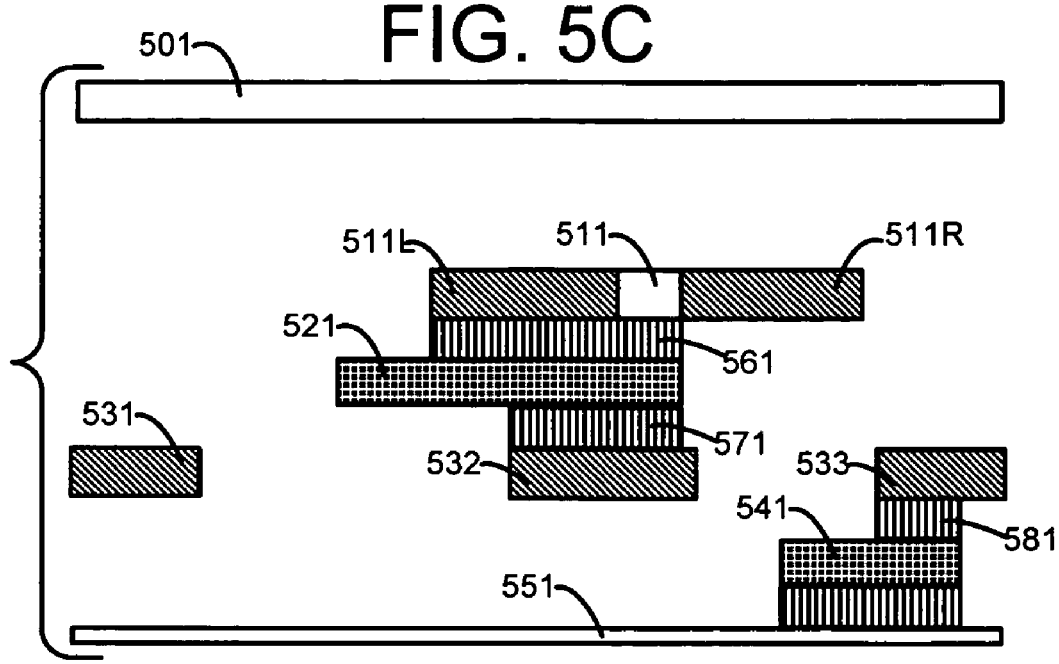
FIG. 5C illustrates the IC layout of FIG. 5A modified to show the effect of the method of FIG. 5B.

In the example shown in FIG. 5A, rectangle 511 has two line ends namely 511L and 511R as shown in FIG. 5C. In this manner, all line ends in the layout are identified, and then in act 592, the computer finds those line ends which are not more than a predetermined distance (called "minSpacing") apart from metal. Next, in act 593, the computer automatically selects those line ends which have exactly two neighbors. In the example layout of FIG. 5A, a right-side line end of rectangle 521 has exactly two neighbors, namely rectangles 511 and 532. Similarly, a right-side line end of rectangle 541 has exactly two neighbors, namely rectangles 551 and 533.

Accordingly, these two rectangles 521 and 541 are selected at this stage. Next step is for computer 150 to automatically filter out rectangles which are completely overlapped by at least one neighbor (as per act 594 in FIG. 5B). In the illustration of FIG. 5A, rectangle 541 is completely overlapped by its neighbor 551 and therefore this rectangle is filtered out at this stage. As a result, computer 150 is left with rectangle 521 as a hot spot candidate.

Note that rectangles 561, 571 and 581 in FIG. 5C show the overlap between neighbors. Specifically, some embodiments of the invention generate rectangle 561 as an intermediate step, to identify overlap between rectangle 511 and rectangle 521. Next, the length of rectangle 561 is determined and compared to length of rectangle 521 and if the two lengths are not equal then rectangle 521 is not coextensive with rectangle 511, which therefore indicates that rectangle 511 is extensible (to the left in FIG. 5C), to make these two rectangles coextensive. Similarly, rectangle 571 is generated in such embodiments to determine an overlap between rectangles 521 and 532. Moreover, rectangle 581 shows overlap between rectangles 533 and 541.

Some embodiments of the invention perform rule-based correction differently for different configurations of layout in hot spot regions, and three such configurations are illustrated in FIGS. 6A-6C. Specifically, after hot spot regions are identified by act 201, and after confirmation in act 202 (see FIG. 2A), the regions are classified into one of three types depending on how many neighbors are present. The presence of neighbors (for the purposes of act 201 which detects hot spots) is determined relative to a side of an end of a rectangle. Specifically, a first type of hot spot region has a line end with a side having zero neighbors (at a distance of minSpacing in the lateral direction i.e. perpendicular to the longitudinal direction of the rectangle). This configuration is illustrated in FIG. 6A wherein the ends of each rectangle are shown shaded. Specifically, rectangle 602 has a right end 602R. A right side 602RR of right end 602R is located at a line 605. Line 605 does not pass through any rectangles. Hence, rectangle 602 extends in the horizontal direction to the right of the figure (i.e. positive x direction) farther than a right side 601RR of right end 601R of rectangle 601. A similar situation is shown in FIG. 6A for the right end of rectangle 603 relative to rectangle 602. This configuration of three rectangles is referred to as Type 1, and one or more correction rules that are specifically known to address hot spots of this type of configuration may be applied, for example as discussed below in reference to FIGS. 7A-7D.

Figure 8A:
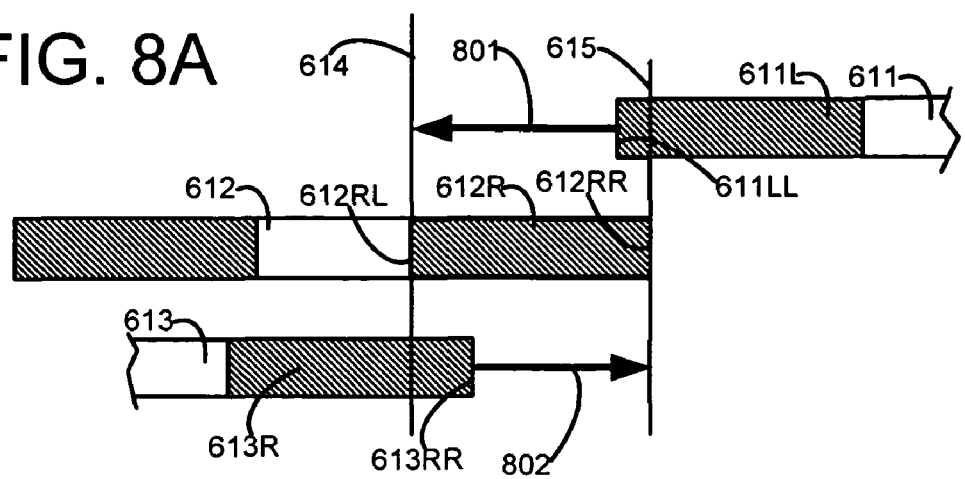
FIGS. 8A-8C illustrate a second type of hot spot and corrections which are applied to this type of hot spot in some embodiments of the invention.

A second type of configuration is illustrated in FIG. 6B wherein each side of an end of a rectangle has exactly one neighbor. Specifically, rectangle 612 has a right end 612R. A right side 612RR of right end 612R extends up to a line 615 in the positive x direction, and line 615 intersects with rectangle 611 within the minSpacing distance from rectangle 612. Hence, there is only one neighbor at the right side of right end of rectangle 612. A slightly different situation is shown in FIG. 6B for the left end 612RL of right end 612R through which passes line 614. As shown in FIG. 6B, this line 614 passes through only one rectangle, namely rectangle 613, within the minSpacing distance from rectangle 612. Hence, once again there is only one neighbor. This staircase configuration of three rectangles is referred to as Type 2, and one or more correction rules that are specifically known to address such "staircase" hot spots may be applied, e.g. as discussed below in reference to FIGS. 8A-8C.

A third type of configuration is illustrated in FIG. 6C wherein each side of an end of a rectangle has exactly two neighbors. Specifically, rectangle 623 has a left side 623LL through which passes a line 626. This line 626 passes through a rectangle 621 in the positive y direction, within the minSpacing distance from rectangle 623 (as measured from a top side 623T). This line 626 also passes through a rectangle 624 in the negative y direction, within the minSpacing distance from rectangle 623 (as measured from a bottom side 623B). Hence, rectangle 623 has two neighbors. This configuration of three rectangles is referred to as Type 3, and one or more correction rules that are specifically known to address such hot spots may be applied, e.g. as discussed below in reference to FIGS. 9A-9I.

Figure 7A:
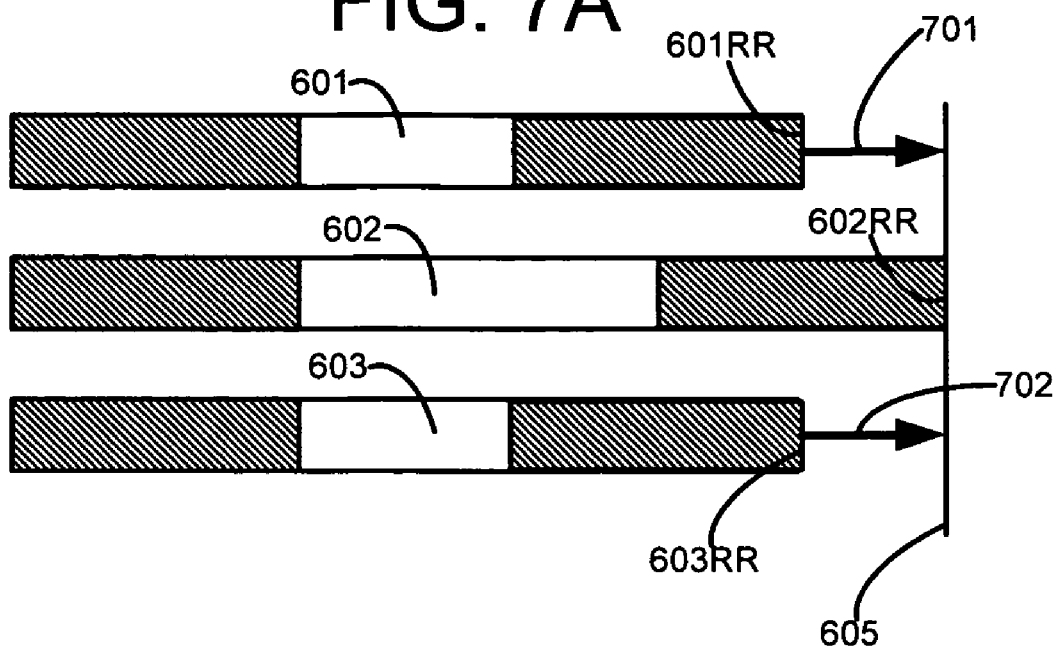
FIGS. 7A-7D illustrate a first type of hot spot and corrections which are applied to this type of hot spot in some embodiments of the invention.
Figure 7B:
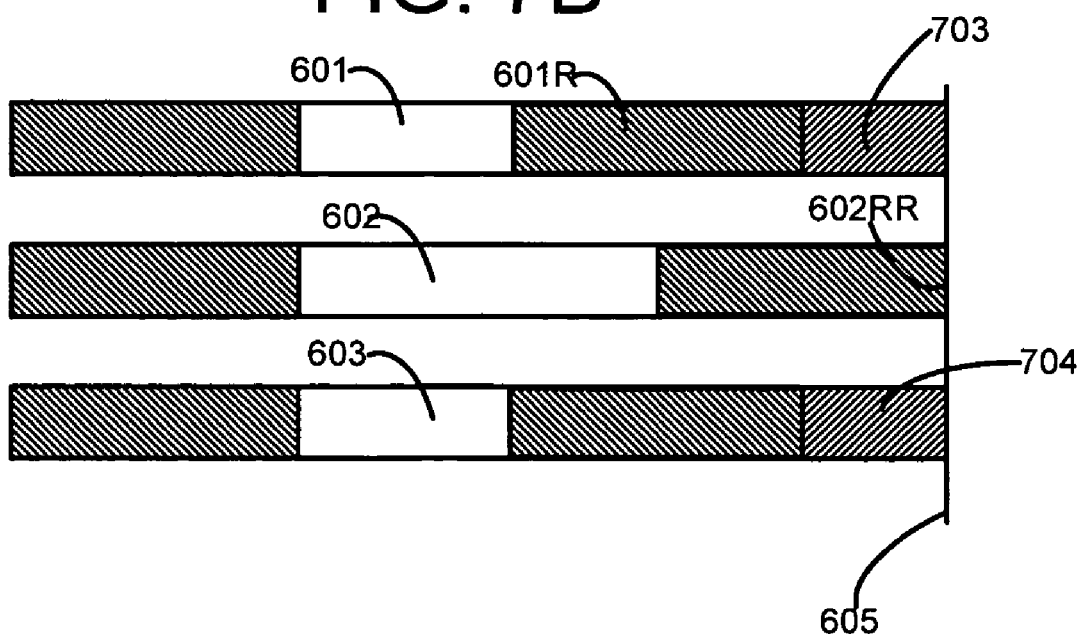
Figure 7C:
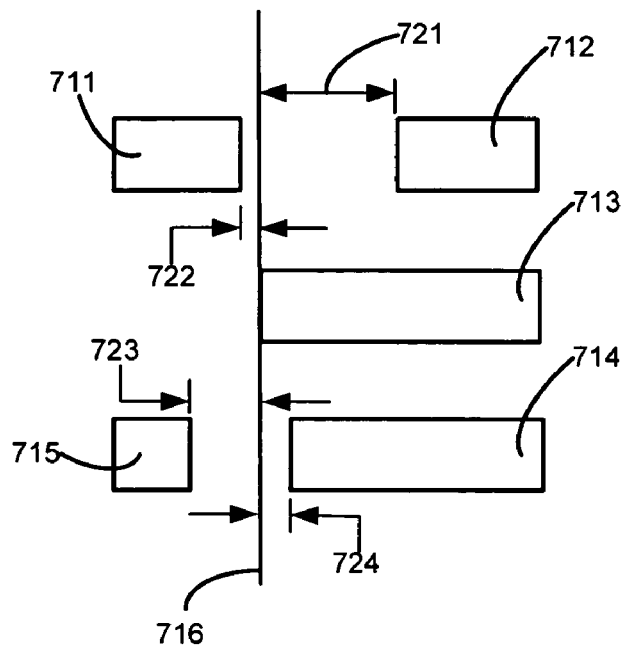

Correction of a type 1 configuration is performed in some embodiments by extension of the neighbors. In the example illustrated in FIG. 7A, arrows 701 and 702 show movement of sides 601RR and 603RR of the respective rectangles 601 and 602 to the right so that these two sides are located vertically in line with a line 605 at which is also located side 602RR of rectangle 602. The result of such movement is shown in FIG. 7B wherein a portion 703 of extended rectangle 601 is shown shaded differently than the line end 601R. Hence, if space permits, the two rectangles 601 and 603 are extended up to right side 602RR of rectangle 602. Hence, the middle rectangle 602 no longer protrudes on the right, and instead is aligned with the neighboring rectangles 601 and 603.

Figure 7D:
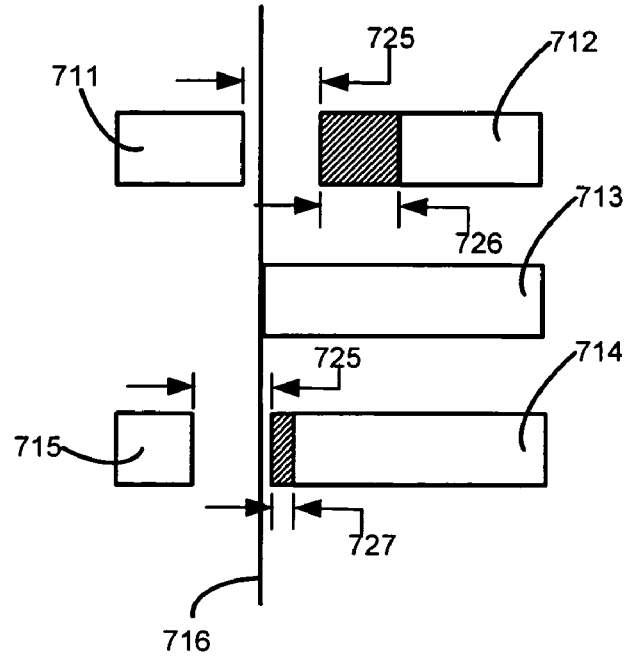

However, in some situations, the above-described extension of neighbors to be coextensive may not be possible and in such situations some embodiments extend the neighbors only as much as possible. For example a design rule check (DRC) rule may require maintenance of a predefined distance, such as minSpacing, between any two adjacent rectangles and if so, the above-described extension is smaller (e.g. to ensure that minSpacing is left or to ensure that a user-defined minimum distance is left). In an illustration shown in FIG. 7C, rectangle 713 protrudes on the left side beyond the two neighbors 712 and 714. Each neighbor 712 and 714 is located adjacent to (and in the same horizontal location as) rectangles 711 and 715. Accordingly if rectangles 712 and 714 are extended through the respective distances 721 and 724 so that their left sides are vertically aligned with line 716 (which passes through the left side of rectangle 713), then remaining distances 722 and 723 from rectangles 711 and 715 violate the DRC rule. Accordingly, as shown in FIG. 7D, rectangles 712 and 714 are extended only by the smaller distances 726 and 727 respectively, so that a distance 725 is maintained relative to the corresponding rectangles 711 and 715.

Figure 8B:
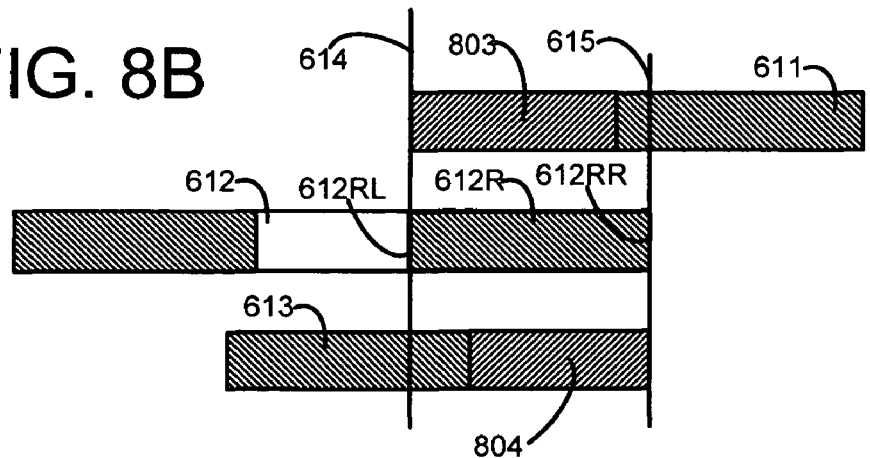

Correction of a type 2 configuration is also performed in some embodiments by extension of neighbors. Although extension is done in two different directions on two different sides, the extension is sufficient to cause ends of the three rectangles to overlap one another. In an example illustrated in FIG. 8A, arrows 801 and 802 show movement of sides 611LL and 613RR of rectangles 611 and 613 to the left and right respectively so that the ends 611L and 613R of these two rectangles between lines 614 and 615 overlap one another and also overlap the end 612R of middle rectangle 612. The result of such movement is shown in FIG. 8B wherein a portion 803 of extended rectangle 611 is shown shaded differently than left end 611L of rectangle 611. Similarly, another portion 804 of extended rectangle 613 is shown shaded differently than right end 613R of rectangle 613. Hence, if space permits, the two rectangles 611 and 613 are extended up to overlap right end 612R of rectangle 612.

Figure 8C:
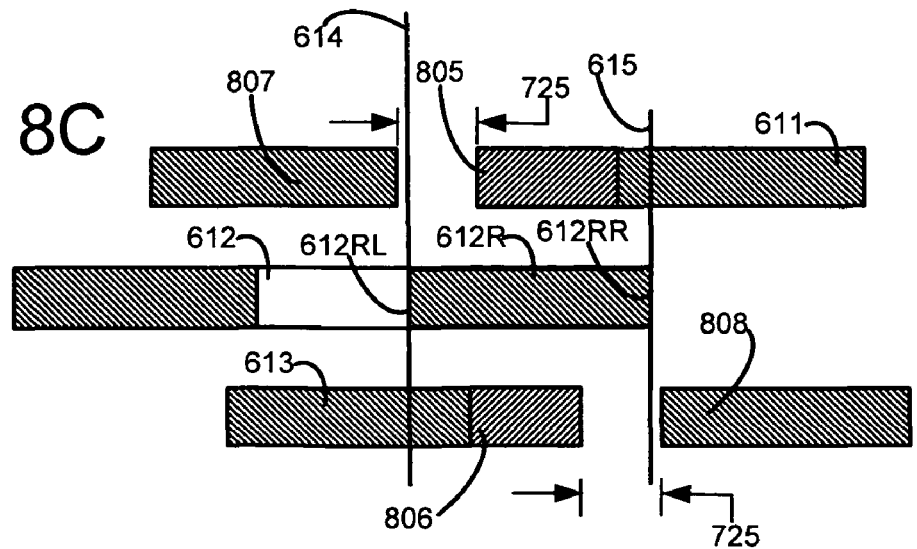

In situations similar to those discussed above for correction of type 1 configurations, here as well the above-described extension of neighbors (as shown in FIG. 8B) may not be possible and in such situations some embodiments extend the neighbors only as much as possible. Hence, if a design rule check (DRC) rule requires maintenance of minSpacing and if each neighbor 611 and 613 is located adjacent to a corresponding rectangle 807 and 808 as shown in FIG. 8C, then the above-described extension is smaller (e.g. to ensure that minSpacing is left or to ensure that a user-defined minimum distance is left). In the illustration shown in FIG. 8C, a distance 725 is maintained by the extended portions 805 and 806 which are smaller than the corresponding extensions 803 and 804 (described above).

Figure 9A:
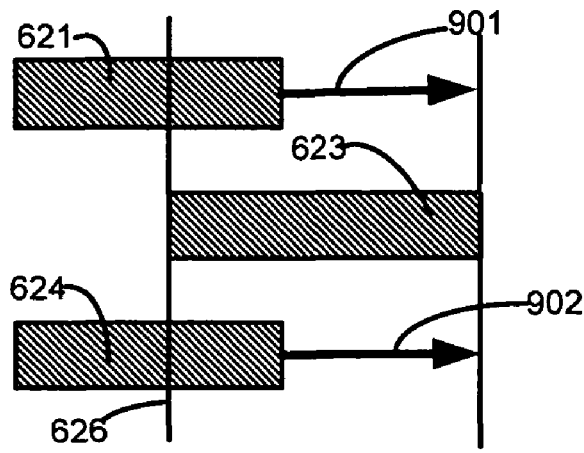
FIGS. 9A-9I illustrate a third type of hot spot and corrections which are applied to this type of hot spot in some embodiments of the invention.

Correction of a type 3 configuration is also performed in some embodiments by extension of neighbors, although each type 3 configuration is further classified into three subtypes. Specifically, a first subtype has one line end with type 3 configuration but the other line edge has a type 1 configuration, and this subtype is called Type 3-1. This subtype is illustrated in FIG. 9A, and it is corrected by the same correction as that described above for Type 1, namely by extension as illustrated by arrows 901 and 902 which are similar to arrows 701 and 702. Once again, it should be apparent that if full extension (up to the right side of middle rectangle 623) is not possible for any reason, then a partial extension is done in several embodiments.

Figure 9B:
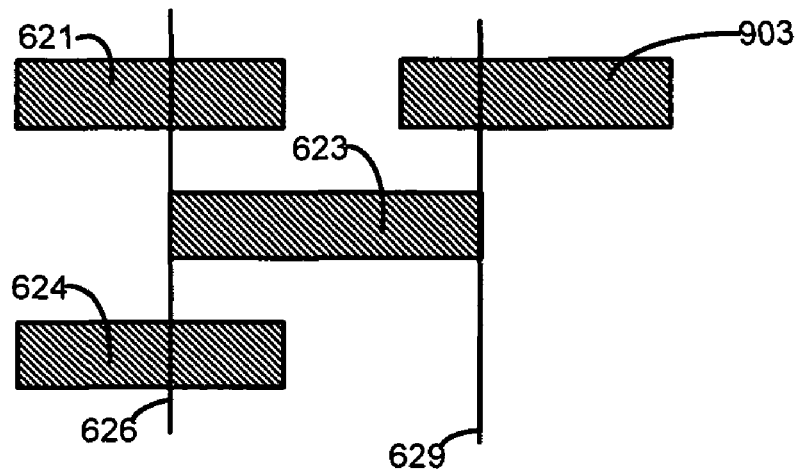
Figure 9C:
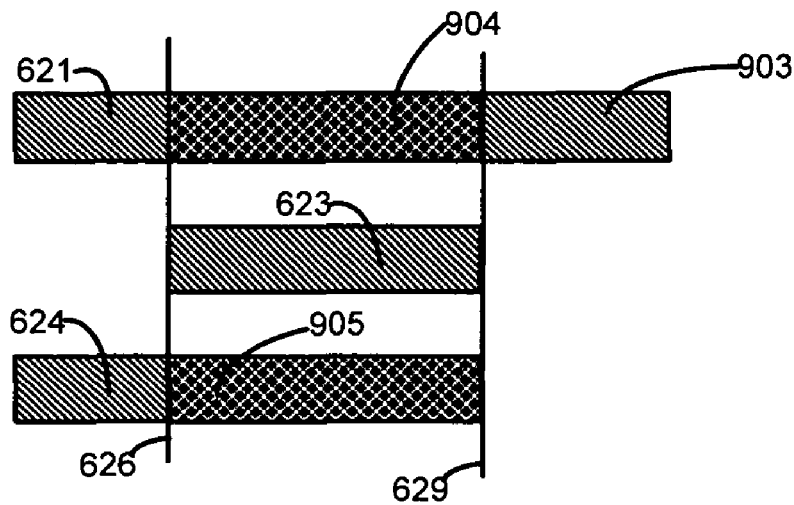

In such embodiments, the computer further classifies a type 3 configuration into a second subtype, called Type 3-2 if one side of the middle rectangle has two neighbors and the other side has one neighbor. This subtype is illustrated in FIG. 9B. To correct this configuration, some embodiments create two rectangles of the same size as the middle rectangle 623. Next, computer 150 automatically overlays a first rectangle 904 between the lines 626 and 629 on the two neighbors 621 and 903 and further overlays a second rectangle 905 also between lines 626 and 629, on the neighbor 624. Lines 626 and 629 pass through the left side and the right side respectively of middle rectangle 623. Therefore, at this stage, all three rectangles 904, 905 and 623 overlap one another.

Figure 9D:
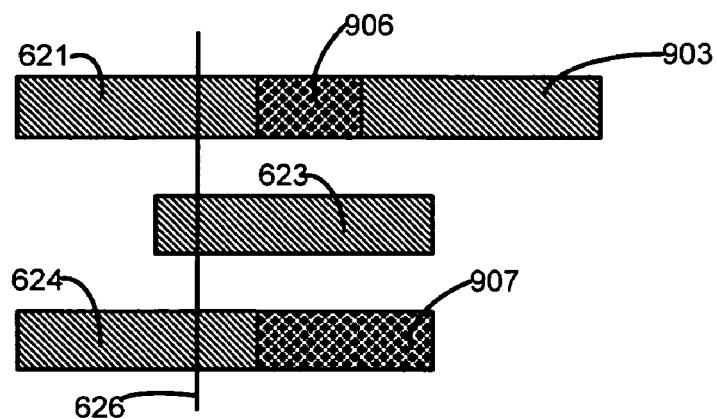
Figure 9E:
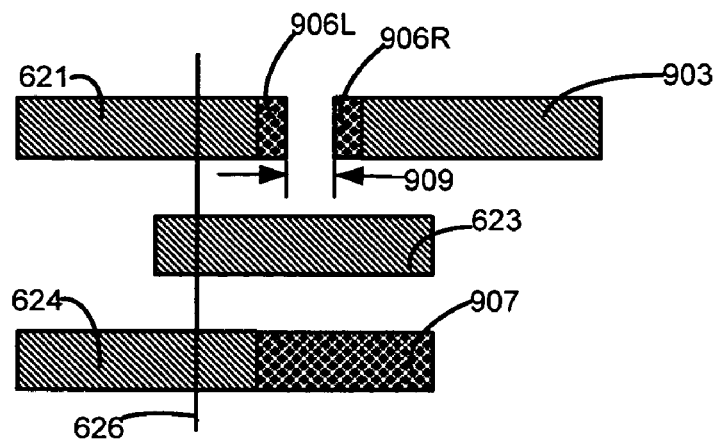

Next, computer 150 automatically shortens each overlaid rectangle until there is no overlap with its neighbor(s), e.g. rectangle 904 when shortened to avoid overlapping rectangles 621 and 903 becomes the overlaid rectangle 906 shown in FIG. 9D. Similarly, overlaid rectangle 907 in FIG. 9D is a shortened version of overlaid rectangle 905 in FIG. 9C. Thereafter, a piece of an overlaid rectangle which is connecting two neighboring rectangles is removed from a central region thereof, and the remaining pieces are used to extend the respective neighboring rectangles. Therefore, a piece in a central region 909 (FIG. 9E) is removed from overlaid rectangle 906 (FIG. 9D) thereby to leave behind pieces 906L and 906R which are respectively used to extend the neighboring rectangles 621 and 903. Note that rectangle 624 may be extended up to the full extent of rectangle 907, i.e. up to a right side of rectangle 623, because there is no adjacent rectangle.

Figure 9F:
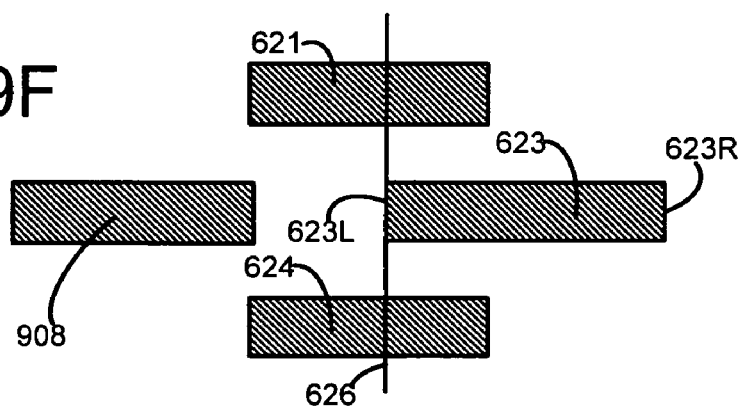
Figure 9G:
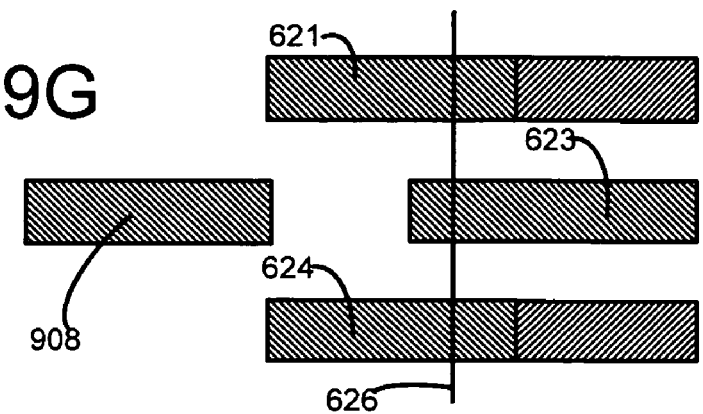
Figure 9H:
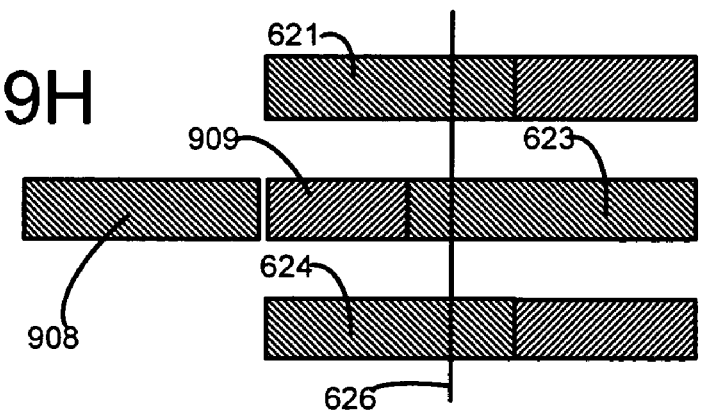
Figure 9I:
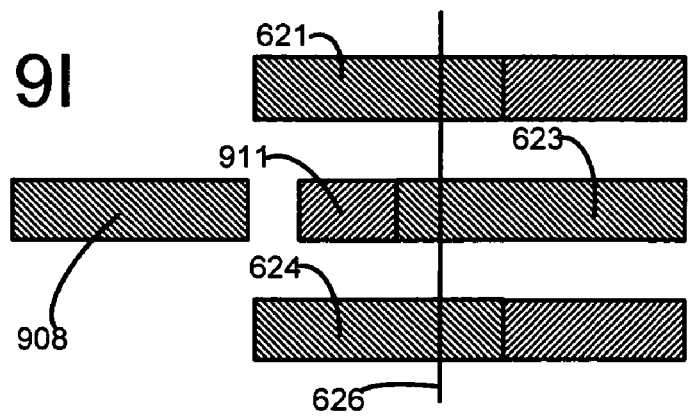

A third subtype, called Type 3-3 is illustrated in FIG. 9F. Note that a right side 623R forms a first subtype which is corrected as shown in FIG. 9G, but despite this correction, a pinch may occur at a left side 623L. Hence, as shown in FIG. 9H, the left side 623L is extended by a portion 909 (FIG. 9H), but the amount of extension may be limited by minSpacing, in which case the actual extension is only by portion 911 (FIG. 9I).

Figure 10A:
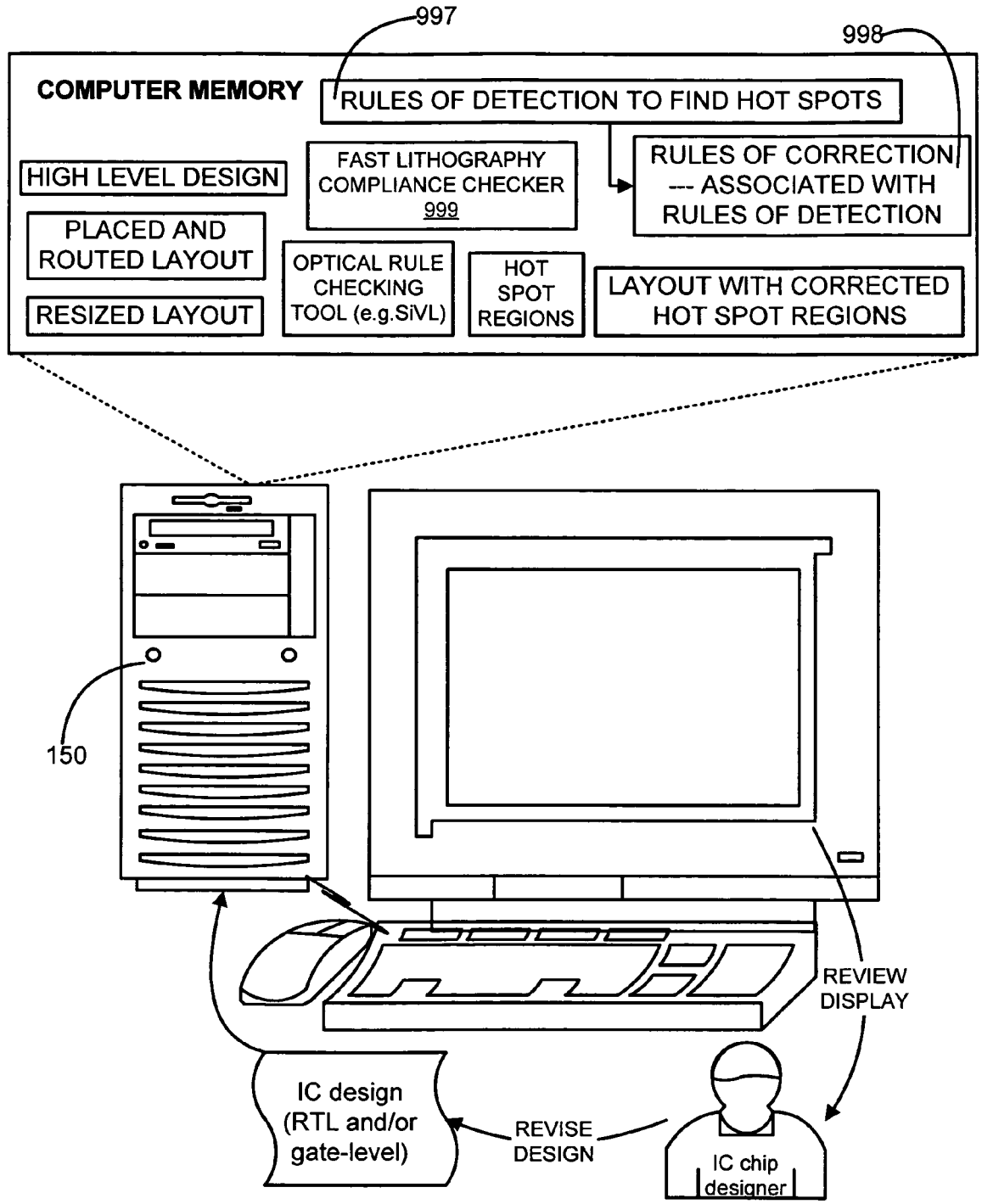
FIG. 10A illustrates, in a block diagram, a computer that is programmed in accordance with the invention.
Figure 10B:
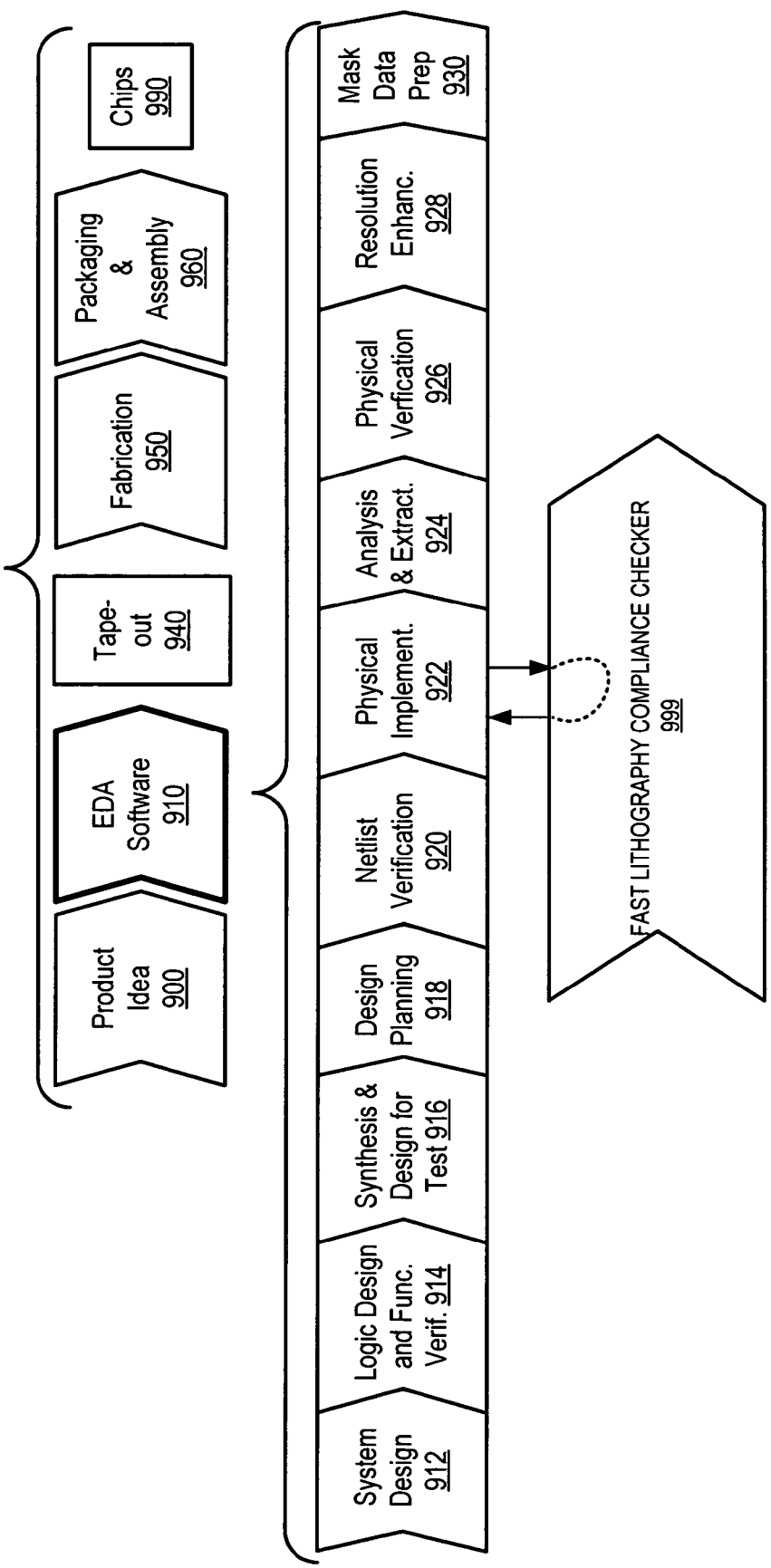
FIG. 10B illustrates, a simplified representation of an exemplary digital ASIC design flow in accordance with the invention.

Note that any fast lithography compliance checker of the type described above (e.g. in reference to FIG. 2A) may be used in a digital ASIC design flow, which is illustrated in FIG. 10B in a simplified exemplary representation. At a high level, the process of designing a chip starts with the product idea (900) and is realized in a EDA software design process (910). When the design is finalized, it can be taped-out (event 940). After tape out, fabrication process (950) and packaging and assembly processes (960) occur resulting, ultimately, in finished chips (result 990).

The EDA software design process (910) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Floorplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro product. Note that a fast lithography compliance checker 999 (of the type described above in reference to FIG. 2A) can be used during this stage 922, as shown in FIG. 10B. If the displayed results are not satisfactory, a chip designer may go back to stage 916 to make changes to the IC design as shown in FIG. 10A. Although circuitry and portions thereof (such as rectangles) may be thought of at this stage as if they exist in the real world, it is to be understood that at this stage only a layout exists in a computer 150. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 928): This involves geometric manipulations of the layout to improve manufacturability of the design. Exemplary EDA software products from Synopsys, Inc. that can be used at this include iN-Phase, Proteus, and AFGen products.

Mask data preparation (stage 930): This provides the "tape-out" data for production of masks for lithographic use to produce finished chips. Exemplary EDA software products from Synopsys, Inc. that can be used at this include the CATS(R) family of products. Actual circuitry in the real world is created after this stage, in a wafer fabrication facility (also called "fab").

The data structures and software code for implementing one or more acts described in this detailed description can be encoded into a computer-readable medium, which may be any storage medium and/or any transmission medium that can hold code and/or data for use by a computer. Storage medium includes, but is not limited to, magnetic and optical storage devices such as disk drives, magnetic tape, CDs (compact discs), and DVDs (digital versatile discs). Transmission medium (with or without a carrier wave upon which the signals are modulated) includes but is not limited to a wired or wireless communications network, such as the Internet. In one embodiment, the transmission medium uses a carrier wave that includes computer instruction signals for carrying out one or more steps performed by the methods illustrated in FIG. 2A. In another embodiment, the transmission medium uses a carrier wave that includes instructions to perform a method as illustrated in FIG. 2A.

Note that a computer system used in some embodiments to implement a fast lithography compliance checker of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Appendix A which is located below, just before the claims, is an integral portion of this detailed description and is incorporated by reference herein in its entirety. Appendix A contains pseudo-code and related information for implementing one illustrative embodiment of a fast lithography compliance checker in accordance with the invention, for example by use of a software product called "Hercules" available from Synopsys, Inc.

Numerous modifications and adaptations of the embodiments described herein will become apparent to the skilled artisan in view of this disclosure.

Accordingly, numerous modifications and adaptations of the embodiments described herein are encompassed by the scope of the invention.

APPENDIX A

```
1
2
3 /* THIS IS A COMMENT */
4 /* Pseudo code for a Hercules script for identification and correction of Line End
5 pinches written by Alex Miloslavsky and Gerry Lukpat */
6
7 /* List of parameters with default values fro 65 nm design */
8 VARIABLE minWidth = 0.1;
9 VARIABLE bigMetalWidth    = 0.24;
10 VARIABLE minSpacing       = 0.100;
11 VARIABLE smallRectMaxWidth = 0.4;
12 VARIABLE maxDistToNeighbors = 0.7;
13 VARIABLE lineEndAddition = 0.2;
14 VARIABLE verySmallElement = 0.03; /* Global */
15 VARIABLE verySmallElementMaxArea = minWidth*verySmallElement;
16 VARIABLE ambit = 0.704;
17 VARIABLE drcFixingGap = 0.12;
18
19 Macro hotSpotsMacro is executed for each metal0 and corresponding VIAs c1
20 and c2
21 define hotSpotsMacro( metal0, c1, c2)
22 /* We are not looking for hot spots in dummy metal. For this purpose we are
23 selecting only metal which interacts with VIAS */
24 Combine VIA c1 with VIA c2 into cnt
25 SELECT metal0, which interacts with cnt into metal
26 /********************* Metal Classification Generic Rutines *********************/
27 Undersize metal by 49% of bigMetalWidth into bigMetalID
28 Select metal ENCLOSING bigMetalID into big_metal0
29 Select metal0 which has width not more than minWidth into narrow_metal0
30 Select metal which has width not more than minWidth into narrow_metal
31 /* Big metal may have narrow handles. We need to get rid of them */
32 Subtract narrow_metal0 from big_metal0 into big_metal
33 Subtract big_metal from metal into not_big_metal
```

APPENDIX A-continued

```
34 Subtract narrow_metal from not_big_metal into not_med_metal
35 Select med_metal with width no more than minWidth into narrow_med_metal
36 Select metal with width no more than minWidth (OPTION only parallel edges)
37 into narrow_metal_straight
38 Combine narrow_metal with narrow_med_metal into narrow_metal20
39 /*---------- Get rid of small pieces of narrow metal, which are of no interest --------
40 -----*/
41 Select narrow_metal_straight with area no more than verySmallElementMaxArea
42 into verySmall_rect
43 Select verySmall_rect which touches narrow_med_metal into verySmall_rectOK
44 Subtract verySmall_rectOK from verySmall_rect into verySmall_rectNOK
45 Subtract verySmall_rectNOK from narrow_metal20 into narrow_metal2
46 /* Line End Macro at the end. Calliing Macro below generates edges ol line ends
47 of narrow_metal2 into metal_lineEnd0_v */
48 GET_LINE_END(narrow_metal2, metal_lineEnd0_v)
49 /*********************** Line End Hot Spots Detection********************************/
50 Build a rectangle on metal_lineEnd0_v of size smallRectMaxWidth into
51 NlineEnd_box_temp
52 Select overlap NlineEnd_box_temp AND narrow_metal_straight into
53 NlineEnd_box
54 Generate edges of NlineEnd_box into NlineEnd_box_side_v
55 Check for metal which is no more than minSpacing apart from
56 NlineEnd_box_side_v into Nside_DRC
57 Select NlineEnd_box_side_v which touches Nside_DRC into
58 NlineEnd_box_side_v_DRC
59 Select NlineEnd_box which touches NlineEnd_box_side_v_DRC twice into
60 NlineEnd_box_DRC2
61 Select Nside_DRC which touches NlineEnd_box_DRC2 into Nside_DRCcand
62 Build rectangle of width=0.01 on the edge where NlineEnd_box_DRC2 touches
63 Nside_DRCcand into NlineEnd_box_DRC2_10
64 Build rectangle of width=0.01 on the edge where Nside_DRCcand
65 touchesNlineEnd_box_DRC2 into Nside_DRCcand_10
66 Select NlineEnd_box_DRC2_10 which is inside Nside_DRCcand_10 into
67 NlineEnd_box_DRC2_10_Bad
68 Select NlineEnd_box_DRC2 which touches NlineEnd_box_DRC2_10_Bad into
69 NlineEnd_box_DRC2Bad
70 Subtract NlineEnd_box_DRC2Bad from NlineEnd_box_DRC2 into HS_LE
71
72 /** Final Step is to build a vicinity of HS_LE which is of interest defined by
73 variable ambit **/
74 Size up HS_LE by ambit into HS_cand_sz
75 Overlap HS_cand_sz and metal0 into metal0
76 Overlap HS_cand_sz and metal into metal
77 Overlap HS_cand_sz metal_lineEnd0_v into metal_lineEnd0_v
78
79 /** We are interested in both ends of a HotSpot **/
80 Select metal_lineEnd0_v which touches HS_LE into HS_LE1_v
81 Generate edge of HS_LE into HS_cand_v
82 Subtract HS_LE from metal0 into not_HS_cand
83 Overlap HS_cand_v and not_HS_cand into HS_LE2_v
84 Combine HS_LE1_v and HS_LE2_v into HS_LE_v
85 Subtract HS_LE_v from HS_cand_v into HS_LE_side_v
86 Exteng both ends of HS_LE_v by (minWidth + minSpacing + 0.02) into
87 HS_LE_vx
88 Reverse direction of HS_LE_vx into HS_LE_vxR
89 /******************Classification of the Line End**********************/
90 /******************Protruded Line End*********************/
91 Select HS_LE_vxR which interacts with metal0 only once into HS_LE_vxR1
92 /******************Stairs End*********************/
93 Select HS_LE_vxR which interacts with metal0 only twice into HS_LE_vxR2
94 /******************Inverted Line End*********************/
95 Select HS_LE_vxR which interacts with metal0 only three times into
96 HS_LE_vxR3
97 /*********************************************************/
98 /****************Fixing for Protruded Line End ********************/
99 Check for HS_LE_vxR1 which is closer than maxDistToNeighbors to
100 metal_lineEnd0_v into HS_LE_vxR1_lineUpFix0
101 Select HS_LE_vxR1_lineUpFix0 which interacts with HS_LE into
102 HS_LE_vxR1_lineUpFix1
103 Subtract HS_LE_vxR1_lineUpFix1 from HS_LE_vxR1_lineUpFix0 into
104 HS_LE_vxR1_lineUpFix
105 /** Do we have DRC problem with this fix?**************/\
106 /** If "Yes" we subtract a rectangle, for example, 120 nm from a DRC**/
107 Check for HS_LE_vxR1_lineUpFix which is closer than minSpacing to metal0
108 into HS_LE_vxR1_lineUpFix_DRC
109 Select HS_LE_vxR1_lineUpFix which touches HS_LE_vxR1_lineUpFix_DRC
110 into HS_LE_vxR1_lineUpFixBad
111 Generate edge of HS_LE_vxR1_lineUpFix_DRC into
112 HS_LE_vxR1_lineUpFix_DRC_v
113 Overlap HS_LE_vxR1_lineUpFix_DRC_v and metal0 into
```

APPENDIX A-continued

```
114 HS_LE_vxR1_lineUpFix_DRC_v_side
115 Build a rectangle on HS_LE_vxR1_lineUpFix_DRC_v_side with width
116 drcFixingGap into HS_LE_vxR1_lineUpFix_DRC_v_side_sz
117 Subtract HS_LE_vxR1_lineUpFix_DRC_v_side_sz from
118 HS_LE_vxR1_lineUpFixBad into HS_LE_vxR1_lineUpFixBadImp
119 Subtract HS_LE_vxR1_lineUpFixBad from HS_LE_vxR1_lineUpFix into
120 HS_LE_vxR1_lineUpFixGood
121 Combine HS_LE_vxR1_lineUpFixGood and HS_LE_vxR1_lineUpFixBadImp into
122 HS_LE_vxR1_lineUpFixFinal
123 /******************Fixing for Stairs End*********************/
124 Subtract HS_LE from HS_LE_vxR2 into HS_LE_vxR2_must0
125 Reduce both ends of HS_LE_vxR2_must0 by 0.02 into HS_LE_vxR2_must1
126 Select HS_LE_vxR2_must1 which interacts with metal into HS_LE_vxR2_must2
127 Subtract HS_LE_vxR2_must2 from HS_LE_vxR2_must1 into
128 HS_LE_vxR2_must
129 Check for HS_LE_vxR2_must which is closer than 2*smallRectMaxWidth to
130 metal_lineEnd0_v into HS_LE_vxR2_lineUpFix00
131 Subtract metal0 from HS_LE_vxR2_lineUpFix00 into HS_LE_vxR2_lineUpFix0
132 Select HS_LE_vxR2_lineUpFix00 which interacts with metal exactly twice into
133 HS_LE_vxR2_lineUpFixNo
134 Subtract HS_LE_vxR2_lineUpFixNo from HS_LE_vxR2_lineUpFix0 into
135 HS_LE_vxR2_lineUpFix1
136 /* We should ignore Fix Candidate3 which are longer than stairs itself */
137 /* This case may occur when stairs has a facing misaligned neighbor */
138 Build rectangle of width=(minSpacing – 0.002) on HS_LE_side_v into
139 HS_LE_side_v_sz
140 Select HS_LE_vxR2_lineUpFix1 which interacts with HS_LE_side_v_sz into
141 HS_LE_vxR2_lineUpFix1No
142 Subtract HS_LE_vxR2_lineUpFix1No from HS_LE_vxR2_lineUpFix1 into
143 HS_LE_vxR2_lineUpFixCand
144 /* Let us verify if we have drc violations after remedy */
145 /** If "Yes" we subtract a rectangle, for example, 120 nm from a DRC**/
146 Check for HS_LE_vxR2_lineUpFixCand which is closer than minSpacing to
147 metal0 into HS_LE_vxR2_lineUpFix_DRC
148 Select HS_LE_vxR2_lineUpFixCand which touches
149 HS_LE_vxR2_lineUpFix_DRCinto HS_LE_vxR2_lineUpFixCandBad
150 Generate edge of HS_LE_vxR2_lineUpFix_DRC into
151 HS_LE_vxR2_lineUpFix_DRC_v
152 Overlap HS_LE_vxR2_lineUpFix_DRC_v and metal0 into
153 HS_LE_vxR2_lineUpFix_DRC_v_side
154 Build rectangle of width drcFixingGap on HS_LE_vxR2_lineUpFix_DRC_v_side
155 into HS_LE_vxR2_lineUpFix_DRC_v_side_sz
156 Subtract HS_LE_vxR2_lineUpFix_DRC_v_side_sz from
157 HS_LE_vxR2_lineUpFixCandBad into HS_LE_vxR2_lineUpFixBadImp
158 Subtract HS_LE_vxR2_lineUpFixCandBad from HS_LE_vxR2_lineUpFixCand
159 into HS_LE_vxR2_lineUpFixGood
160 Combine HS_LE_vxR2_lineUpFixGood and HS_LE_vxR2_lineUpFixBadImp into
161 HS_LE_vxR2_lineUpFixFinal
162 /****************Fixing for Inverted Line End ************************/
163 /**Case Inverted-Protruded already taken care of. We consider cases I-I and I-
164 Stairs**/
165 /**Plus for convenience we added case Stairs-Stairs to fill a gap in a special
166 subcase**/
167 /**when middle line has a small neighbor on one side and 2 neighbors on the
168 other side**/
169 /We operate in rectangle(s) parallel and equal to middle rectangle/
170 Select HS_LE_v which touches HS_LE_vxR3 into HS_LE_v_inv
171 Select HS_LE which touches HS_LE_v_inv exactly twice into HS_cand_inv2
172 Select HS_LE which touches HS_LE_v_inv exactly once into HS_cand_inv1
173 Select HS_LE_v which touches HS_LE_vxR2 into HS_LE_v_stair
174 Select HS_cand_inv1 which touches HS_LE_v_stair exactly once into
175 HS_cand_inv1s
176 Select HS_LE which touches HS_LE_v_stair exactly twice into HS_cand_stair
177 Combine HS_cand_inv2 and HS_cand_inv1s into HS_cand_inv
178 Combine HS_cand_inv and HS_cand_stair into HS_cand_invs
179 Generate side edges of HS_cand_invs into HS_inv_side_v
180 Build rectangle of width=minSpacing on HS_inv_side_v into HS_inv_side_v_sz1
181 Build rectangle of width=(minSpacing + minWidth) on HS_inv_side_v into
182 HS_inv_side_v_sz2
183 Subtract HS_inv_side_v_sz1 from HS_inv_side_v_sz2 into HS_inv_side_v_sz
184 Subtract metal0 from HS_inv_side_v_sz into HS_inv_DRC0
185 /We do not need case when rectangle already contains fix for stairs/
186 Select HS_inv_DRC0 which interacts with HS_LE_vxR2 lineUpFixFinal into
187 HS_inv_DRCS
188 Subtract HS_inv_DRCS from HS_inv_DRC0 into HS_inv_DRC
189 Build square in the center of HS_inv_DRC of width=drcFixingGap into
190 HS_inv_DRC_square
191 Subtract HS_inv_DRC_square from HS_inv_DRC into HS_cand_inv2_Fix0
192 /**We would like to get rid of not square fixes. Simple filter **/
193 Select HS_cand_inv2_Fix0 which has exactly 4 corners into HS_cand_inv2_Fix
```

APPENDIX A-continued

```
194 /*****************Extending Short Inverted Rectangle *************************/
195 /** Experiments show that short Inverted Rectangle does make sense to extend
196 **/
197 Select HS_LE which touches HS_LE_v_inv into HS_cand_in
198 Select HS_cand_in with area less than smallRectMaxWidth*(minWidth – 0.001)
199 into HS_cand_inShort
200 Overlap HS_LE_v_inv and HS_cand_inShort into HS_LE_v_inv_Short
201 Build rectangle of width lineEndAddition on HS_LE_v_inv_Short into
202 HS_inv_lineEndAdditionTry
203 /Just built extension may overlap with metal or have DRC violations/
204 Subtract metal0 from HS_inv_lineEndAdditionTry into HS_inv_lineEndAddition
205 Select HS_inv_lineEndAddition which touches metal0 exactly once into
206 HS_inv_lineEndAddition1
207 Check for HS_inv_lineEndAddition1 which is closer than minSpacing to metal0
208 into HS_inv_lineEndAddition1_DRC
209 Generate edge of HS_inv_lineEndAddition1_DRC into
210 HS_inv_lineEndAddition1_DRC_v
211 Overlap HS_inv_lineEndAddition1_DRC_v and metal0 into
212 S_inv_lineEndAddition1_DRC_v_side
213 Build rectangle of width drcFixingGap on HS_inv_lineEndAddition1_DRC_v_side
214 into HS_inv_lineEndAddition1_DRC_v_side_sz
215 Subtract HS_inv_lineEndAddition1_DRC_v_side_sz from
216 HS_inv_lineEndAddition1 into HS_inv_lineEndAddition1Imp
217 /**Consider case of overlap with metal **/\
218 Select HS_inv_lineEndAddition which touches metal0 exactly twice into
219 HS_inv_lineEndAddition2
220 Build square in the center of HS_inv_lineEndAddition2 of width=drcFixingGap
221 into HS_inv_lineEndAddition2s
222 Subtract HS_inv_lineEndAddition2s from HS_inv_lineEndAddition2 into
223 HS_inv_lineEndAddition2Fix
224 Combine HS_inv_lineEndAddition1Imp and HS_inv_lineEndAddition2Fixinto
225 HS_inv_lineEndAdditionFix0
226 /**We would like to get rid of not square fixes. Simple filter **/\
227 Select HS_inv_lineEndAdditionFix0 which has exactly 4 corners into
228 HS_inv_lineEndAdditionFix
229 /************************Final assembly**************************/\
230 Copy         HS_inv_lineEndAdditionFix into HS_fix
231 Combine HS_fix and HS_LE_vxR2_lineUpFixFinal into HS_fix
232 Combine HS_fix and HS_cand_inv2_Fix into HS_fix
233 Combine HS_fix and HS_LE_vxR1_lineUpFixFinal into HS_fix
234 /*** Clean Up for DRC violations caused by Fixes **************/\
235 Combine HS_fix and narrow_metal2 into narrow_metal2
236 /** Line End Macro which generates edge of narrow_metal2 into
237 metal_lineEnd0_v **/\
238 GET_LINE_END(narrow_metal2, metal_lineEnd0_v)
239 Overlap metal_lineEnd0_v and HS_fix into metal_lineEnd0_v
240 Check for metal_lineEnd0_v closer than minSpacing into HS_fix_DRC
241 Build square in the center of HS_fix_DRC of width drcFixingGapinto
242 HS_fix_DRC_square
243 Subtract HS_fix_DRC_square from narrow_metal2 into narrow_metal2
244 Overlap narrow_metal2 and HS_fix into HS_fix
245 /*** Get Rid of Fixes not attached to a metal **************/
246 Select HS_fix which touches metal into HS_fix
247
248 /********************Line End Macro*************************/
249 /* This is a definition of line end as a line connecting two CONVEX boxes */
250
251 define GET_LINE_END(METALIN, LE_OUT_V)
252 Select convex corners of METALIN into convex_box_big
253 Overlap convex_box_big and METALIN into convex_box_all
254 Check for convex_box_all which are no more than (minWidth – 0.02) apart into
255 metal_lineEnd00
256 Select metal_lineEnd00 which are inside METALIN (edge touch is not allowed )
257 into metal_lineEnd0_in
258 Subtract metal_lineEnd0_in from metal_lineEnd00 into metal_lineEnd0
259 Build rectangle on a edge where metal_lineEnd0 touches METALIN 0.01 inside
260 and outside into metal_lineEnd0_box
261 Get an edge of overlap metal_lineEnd0_box and METALIN into
262 metal_lineEnd0_v0
263 Extend both ends of metal_lineEnd0_v0 by 0.01 VSIZE_TAIL into LE_OUT_V
```

What is claimed is:

1. A computer-implemented method of modifying an integrated circuit (IC) design, the method comprising:

simulating a lithographic process globally on a first layout of an IC design, to obtain an image;

evaluating the image to identify a set of regions in the first layout;

applying at least a first rule to identify subsets of regions from the set of regions, each of the subsets of regions comprising a first feature, a second feature and a third feature parallel to each other in a longitudinal direction, the second feature located in a lateral position between the first feature and the third feature, each of the first feature and the third feature placed and configured to have a lateral edge extending longitudinally in a direction beyond both lateral edges of the second feature;
applying at least a second rule to elongate the second feature; and
generating a second layout of the IC design based on the elongated second feature.

2. The method of claim 1 wherein the second feature is elongated up to a predetermined distance from a fourth feature extending in the longitudinal direction and placed laterally between the first feature and the third feature; and each of said first, second, third and fourth features being separated from one another in said lateral direction by at least said predetermined distance.

3. The method of claim 2, further comprising elongating each of said first feature, said third feature and said fourth feature.

4. The method of claim 1 wherein:
the first layout is obtained by enlarging at least one wire in a placed and routed layout.

5. The method of claim 1 further comprising elongating each of said first feature and said third feature up to a longitudinal position of a lateral edge of said second feature.

6. The method of claim 1 further comprising elongating at least said third feature towards a lateral edge of the second feature.

7. A computer-implemented method of modifying an integrated circuit (IC) design, the method comprising:
at a computing device, identifying a plurality of regions from a first layout of the IC design based at least on (a) evaluating results of simulating a lithographic process and (b) using a detection rule based on neighbors of a region to detect the plurality of regions, wherein each of the plurality of regions comprises a first feature, a second feature and a third feature parallel to each other in a longitudinal direction, the second feature located in a lateral position between the first feature and the third feature, each of the first feature and the third feature placed and configured to have a lateral edge extending in the longitudinal direction beyond both lateral edges of the second feature; and
applying at least a rule of correction to elongate said second feature in the longitudinal direction; and
obtaining a second layout of the IC design based on the elongated second feature.

8. The method of claim 7 wherein:
said evaluating is done prior to said using of the rule of detection.

9. The method of claim 7 wherein:
said evaluating is done subsequent to said using of the rule of detection.

10. The method of claim 7 wherein each of the first feature and the third feature placed and configured to have another lateral edge not extending beyond the lateral edges of the second feature.

11. The method of claim 10 further comprising elongating each of said first and second feature.

12. The method of claim 10 further comprising elongating one of said the first element and the third element.

13. An apparatus for modifying an integrated circuit (IC) design, the apparatus comprising:
a processor;
memory coupled to the processor and storing instructions, which, when executed by the processor cause the processor to:
identify a plurality of regions from a first layout of the IC design based at least on (a) evaluating results of simulating a lithographic process and (b) using a rule of detection to detect the plurality of regions, wherein each of the plurality of regions comprises a first feature, a second feature and a third feature parallel to each other in a longitudinal direction, the second feature located in a lateral position between the first feature and the third feature, each of the first feature and the third feature placed and configured to have a lateral edge extending in the longitudinal direction beyond both lateral edges of the second feature; and
apply at least a rule of correction to elongate the second feature, and
generate a second layout of the IC design based on the elongated second feature.

14. A non-transitory computer readable storage medium storing instructions therefore, the instructions when executed by a processor cause the processor to:
apply a rule of detection to a first layout of an integrated circuit (IC) design to identify a first region comprising a first feature, a second feature and a third feature parallel to each other in a longitudinal direction, the second feature located in a lateral position between the first feature and the third feature the second feature located in a lateral position between the first feature and the third feature, wherein each of the first feature and the third feature is placed and configured to have a lateral edge that extends in the longitudinal direction beyond both lateral edges of the second feature;
apply a rule of correction to the first region to elongate the second feature; and
generate a second layout of the IC design based on the elongated second feature.

15. The computer readable storage medium of claim 14 further comprising instruction to elongate each of said first feature and the second feature.

16. The computer readable storage medium of claim 14 wherein each of the first feature and the third feature placed and configured to have another lateral edge not longitudinally extending beyond the lateral edges of the second feature.

17. The computer readable storage medium of claim 16 wherein said rule of correction further elongates each of said first feature and the second feature.

18. An integrated circuit (IC) fabricated from a digital representation of an IC design, wherein the digital representation is generated by:
simulating a lithographic process globally on a first layout of the IC design to obtain an image;
evaluating the image to identify a set of regions in the first layout;
applying at least a first rule to identify subsets of regions from the set of regions, each of the subsets of regions comprising a first feature, a second feature and a third feature parallel to each other in a longitudinal direction, the second feature located in a lateral position between the first feature and the third feature, each of the first feature and the third feature placed and configured to have a lateral edge extending longitudinally in a direction beyond both lateral edges of the second feature;
applying at least a second rule to elongate the second feature; and
generating a second layout of the IC design based on the elongated second feature.

19. The IC of claim 18 wherein the second feature is elongated up to a predetermined distance from a fourth feature extending in the longitudinal direction and placed laterally between the first feature and the third feature; and each of said first, second, third and fourth features being separated from one another in said lateral direction by at least said predetermined distance.

20. The IC of claim 18 wherein at least said third feature is elongated towards a lateral edge of the second feature.

21. The IC of claim 20, wherein each of said first feature, said third feature and said fourth feature is elongated.

22. The IC of claim 18, wherein the first layout is obtained by enlarging at least one wire in a placed and routed layout.

* * * * *